United States Patent
Kanamori et al.

(10) Patent No.: US 9,601,532 B2
(45) Date of Patent: Mar. 21, 2017

(54) OPTICAL FILTER WITH FABRY-PEROT RESONATOR COMPRISING A PLATE-SHAPED WIRE GRID POLARIZER

(71) Applicant: Panasonic Intellectual Property Management Co., Ltd., Osaka (JP)

(72) Inventors: Katsuhiro Kanamori, Nara (JP); Toshinobu Matsuno, Kyoto (JP); Teruhiro Shiono, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 211 days.

(21) Appl. No.: 14/676,753

(22) Filed: Apr. 1, 2015

(65) Prior Publication Data

US 2015/0206912 A1 Jul. 23, 2015

Related U.S. Application Data

(63) Continuation of application No. PCT/JP2014/003707, filed on Jul. 14, 2014.

(30) Foreign Application Priority Data

Jul. 29, 2013 (JP) ................................ 2013-156981

(51) Int. Cl.
*H01L 27/146* (2006.01)
*G02B 26/00* (2006.01)
*G02B 5/30* (2006.01)

(52) U.S. Cl.
CPC ...... *H01L 27/14621* (2013.01); *G02B 5/3058* (2013.01); *G02B 26/001* (2013.01);
(Continued)

(58) Field of Classification Search
CPC ............. G02B 26/001; G02B 5/3058; H01L 27/14621; H01L 27/14625; H01L 27/14627; H01L 27/14643
See application file for complete search history.

(56) References Cited

U.S. PATENT DOCUMENTS 6,532,111 B2 3/2003 Kurtz et al.
6,665,119 B1 12/2003 Kurtz et al.
(Continued)

FOREIGN PATENT DOCUMENTS

JP 2001-074935 3/2001
JP 2002-328234 11/2002
(Continued)

OTHER PUBLICATIONS

International Search Report of PCT application No. PCT/JP2014/003707 dated Oct. 7, 2014.
(Continued)

*Primary Examiner* — Francis M Legasse, Jr.
(74) *Attorney, Agent, or Firm* — McDermott Will & Emery LLP

(57) ABSTRACT

The present disclosure is an optical filter which includes: a Fabry-Perot resonator equipped with a laminated structure including one sheet of first metal layer, one sheet of second metal layer, and a dielectric layer; and one sheet of plate-shaped wire grid polarizer. The second metal layer is parallel to the first metal layer, the dielectric layer is interposed between the first metal layer and the second metal layer, the one sheet of plate-shaped wire grid polarizer is embedded in the dielectric layer, the one sheet of plate-shaped wire grid polarizer comprises three or more metal wire layers, the metal wire layers are parallel to one another, and the one sheet of plate-shaped wire grid polarizer is parallel to the first metal layer. In the optical filter according to the present (Continued)

invention, the effective extinction ratio of the wire grid polarizer is increased.

16 Claims, 25 Drawing Sheets

(52) U.S. Cl.
CPC .. *H01L 27/14625* (2013.01); *H01L 27/14627* (2013.01); *H01L 27/14643* (2013.01)

(56) References Cited

U.S. PATENT DOCUMENTS

| | | | |
|---|---|---|---|
| 6,788,461 B2 | 9/2004 | Kurtz et al. | |
| 8,334,493 B2 | 12/2012 | Yokogawa | |
| 8,587,080 B2 | 11/2013 | Gidon et al. | |
| 8,759,742 B2 | 6/2014 | Yokogawa | |
| 8,803,959 B2 | 8/2014 | Ariyoshi | |
| 2008/0252799 A1* | 10/2008 | Lee | G02B 5/3058 349/5 |
| 2008/0278811 A1* | 11/2008 | Perkins | G02B 5/3058 359/485.05 |
| 2012/0305523 A1* | 12/2012 | Fernando | G02B 5/3058 216/24 |
| 2012/0319222 A1 | 12/2012 | Ozawa et al. | |
| 2012/0327248 A1 | 12/2012 | Tack et al. | |
| 2013/0075585 A1 | 3/2013 | Kobayashi et al. | |

FOREIGN PATENT DOCUMENTS

| | | |
|---|---|---|
| JP | 2004-280050 | 10/2004 |
| JP | 2009-545150 | 12/2009 |
| JP | 2010-165718 | 7/2010 |
| JP | 2010-263158 | 11/2010 |
| JP | 2012-080065 | 4/2012 |
| JP | 2013-074400 | 4/2013 |
| WO | 20081078264 | 7/2008 |
| WO | 20131080658 | 6/2013 |

OTHER PUBLICATIONS

Yeo-Taek Yoon, et al., "Transmission type color filter incorporating a silver film based etalon", Mar. 1, 2010 / vol. 18, No. 5/ Optics Express, pp. 5344-5349.

Laurent Frey, et al., "Color filters including infrared cut-off integrated on CMOS image sensor", Jul. 4, 2011 / vol. 19, No. 14 / Optics Express, pp. 13073-13080.

* cited by examiner

FIG. 23A
| λ1 | λ2 | λ1 | λ2 |
|---|---|---|---|
| λ4 | λ3 | λ4 | λ3 |
| λ5 | λ6 | λ5 | λ6 |
| λ2 | λ1 | λ2 | λ1 |
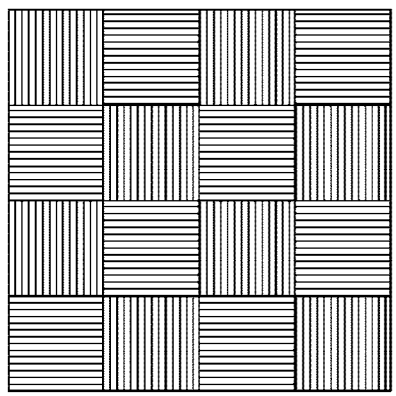
FIG. 23B
FIG. 23C
| λ1 | λ2 | λ1 | λ2 |
|---|---|---|---|
| λ3 | λ3 | λ3 | λ3 |
| λ1 | λ2 | λ1 | λ2 |
| λ3 | λ3 | λ3 | λ3 |
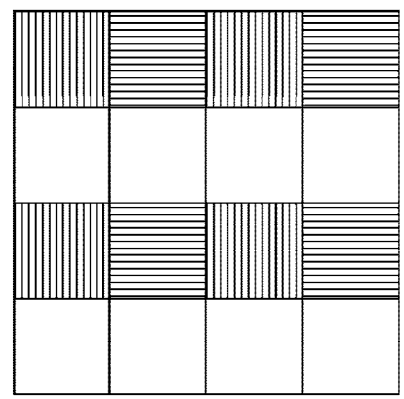
FIG. 23D
FIG. 23E
| λ1 | λ4 | λ5 | λ5 |
|---|---|---|---|
| λ2 | λ3 | λ5 | λ5 |
| λ5 | λ5 | λ1 | λ4 |
| λ5 | λ5 | λ2 | λ3 |
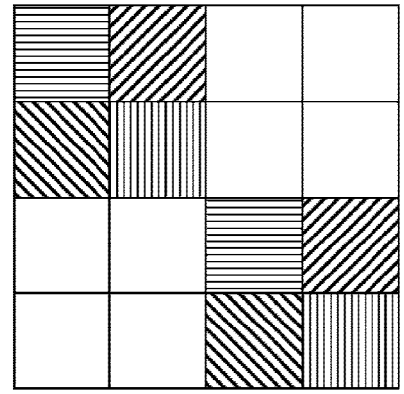
FIG. 23F

OPTICAL FILTER WITH FABRY-PEROT RESONATOR COMPRISING A PLATE-SHAPED WIRE GRID POLARIZER

BACKGROUND

1. Technical Field

The present disclosure relates to an optical filter which obtains both of a color image and a polarized light image at the same time, and relates to a polarization imaging device which uses the filter.

2. Description of the Related Art

In recent years, an imaging element (polarization imaging device) which obtains a color image and a polarized light image at the same time has been required in the fields of examination endoscopes, stereoscopic imaging cameras, on-vehicle cameras, and the like. If polarized light information is obtained in addition to color image information, halation can be removed from reflected light. In addition, if polarized light information is obtained, the normal line direction of a surface of an object can be estimated; thus, surface irregularity and a flaw of the object can be detected, and spilled water and an obstacle on a road surface can be detected. Further, by using a polarization imaging device in combination with a polarized illumination, if an object is a semi-transparent mucus membrane, the information of the surface structure of the mucus membrane can be obtained. In order to realize these functions, an imaging device equipped with a polarizer is necessary. As the polarizer, a wire grid polarizer, which polarizes light in a wide visible light region, is effectively used.

U.S. Pat. No. 8,759,742 and U.S. Patent Application Publication No. 2012/0319222 disclose that, in order to obtain a color image and a polarized light image at the same time, on an upper layer or a lower layer of a conventional color solid-state image sensor is formed a mosaic array in which wire grid polarizers in different directions are combined with each other.

SUMMARY

An optical filter according to the present disclosure includes: a Fabry-Perot resonator equipped with a laminated structure including one sheet of first metal layer, one sheet of second metal layer, and a dielectric layer; and one sheet of plate-shaped wire grid polarizer, wherein the second metal layer is parallel to the first metal layer, the dielectric layer is interposed between the first metal layer and the second metal layer, the one sheet of plate-shaped wire grid polarizer is embedded in the dielectric layer, the one sheet of plate-shaped wire grid polarizer comprises three or more metal wire layers, the metal wire layers are parallel to one another, and the one sheet of plate-shaped wire grid polarizer is parallel to the first metal layer.

A polarization imaging element according to the present disclosure includes: a photoelectric conversion element having an imaging surface; and a first optical filter disposed to face the imaging surface, wherein the first optical filter is the above-described optical filter.

A polarization imaging device according to the present disclosure includes: a plurality of polarization imaging elements, wherein each of the plurality of polarization imaging elements is the above-described polarization imaging element.

A spirit of the present disclosure includes: the above-described polarization imaging device; and a stereoscopic polarization imaging device equipped with a micro-lens array combined with the polarization imaging device.

According to an exemplary embodiment of the present disclosure, two parallel metal layers and a dielectric body between the metal layers form the Fabry-Perot type interference color filter. The function of a color filter is realized by using a phenomenon in which light is multiple-reflected between the two metal layers and only the light having a resonance wavelength depending on a metal layer interval passes through. In the exemplary embodiment of the present disclosure, there is provided a wire grid polarizer between the two metal layers; thus, even if the extinction ratio of the polarizer is low, light passes through the wire grid polarizer many times when the light is multiply reflected between the two metal layers, with the result that the effective extinction ratio of the wire grid polarizer is increased.

BRIEF DESCRIPTION OF DRAWINGS

FIG. 23A is a diagram showing another configuration of the optical filter related to the seventh exemplary embodiment of the present disclosure;

FIG. 23B is a diagram showing another configuration of the optical filter related to the seventh exemplary embodiment of the present disclosure;

FIG. 23C is a diagram showing another configuration of the optical filter related to the seventh exemplary embodiment of the present disclosure;

FIG. 23D is a diagram showing another configuration of the optical filter related to the seventh exemplary embodiment of the present disclosure;

FIG. 23E is a diagram showing another configuration of the optical filter related to the seventh exemplary embodiment of the present disclosure;

FIG. 23F is a diagram showing another configuration of the optical filter related to the seventh exemplary embodiment of the present disclosure;

DETAILED DESCRIPTION OF THE EMBODIMENTS

In the conventional polarization imaging device, it is necessary to form a mosaic array made up of many wire grid polarizers each of which has the size of a pixel. In other words, the wire grid polarizers need to be patterned and two-dimensionally arranged with the metal wire directions being different in each pixel. In the case where a pixel has a rectangular area of, for example, 2 □×2 □m, the wire length of a wire grid polarizer covering each pixel is about 2 □m. In the case where the wire length is as short as this, even if the pitch (line and space) of the metal wires is minimized to be 100 nm or smaller, the extinction ratio of the wire grid polarizer is lowered to be 10:1 or lower. This is described in, for example, U.S. Patent Application Publication No. 2012/0319222.

Generally, a polarizer used as an optical element for an experiment of basic polarization imaging has a large size. Thus, when a polarization imaging device is used for an experiment, such an issue as described above does not occur, and the extinction ratio of the wire grid polarizer reaches about 3000:1. As described above, the performance of a wire grid polarizer is deteriorated with a shorter wire length; thus, what can be realized in basic experiments cannot be realized with practical polarization imaging devices.

As previously described, removal of halation is a typical example of applications of polarization imaging. In order to perform removal of halation, the extinction ratio needs to be at least 100:1 or higher. Experiments of the inventors of the present invention show that it is impossible to sufficiently remove halation with the extinction ratio of about 10:1. That is to say, it is impossible to actually remove halation by using a polarization imaging device equipped with a conventional mosaic of wire grid polarizers.

In the following, exemplary embodiments of the present disclosure which solves the above problem(s) will be described with reference to the drawings.

First Exemplary Embodiment

Figure 1:
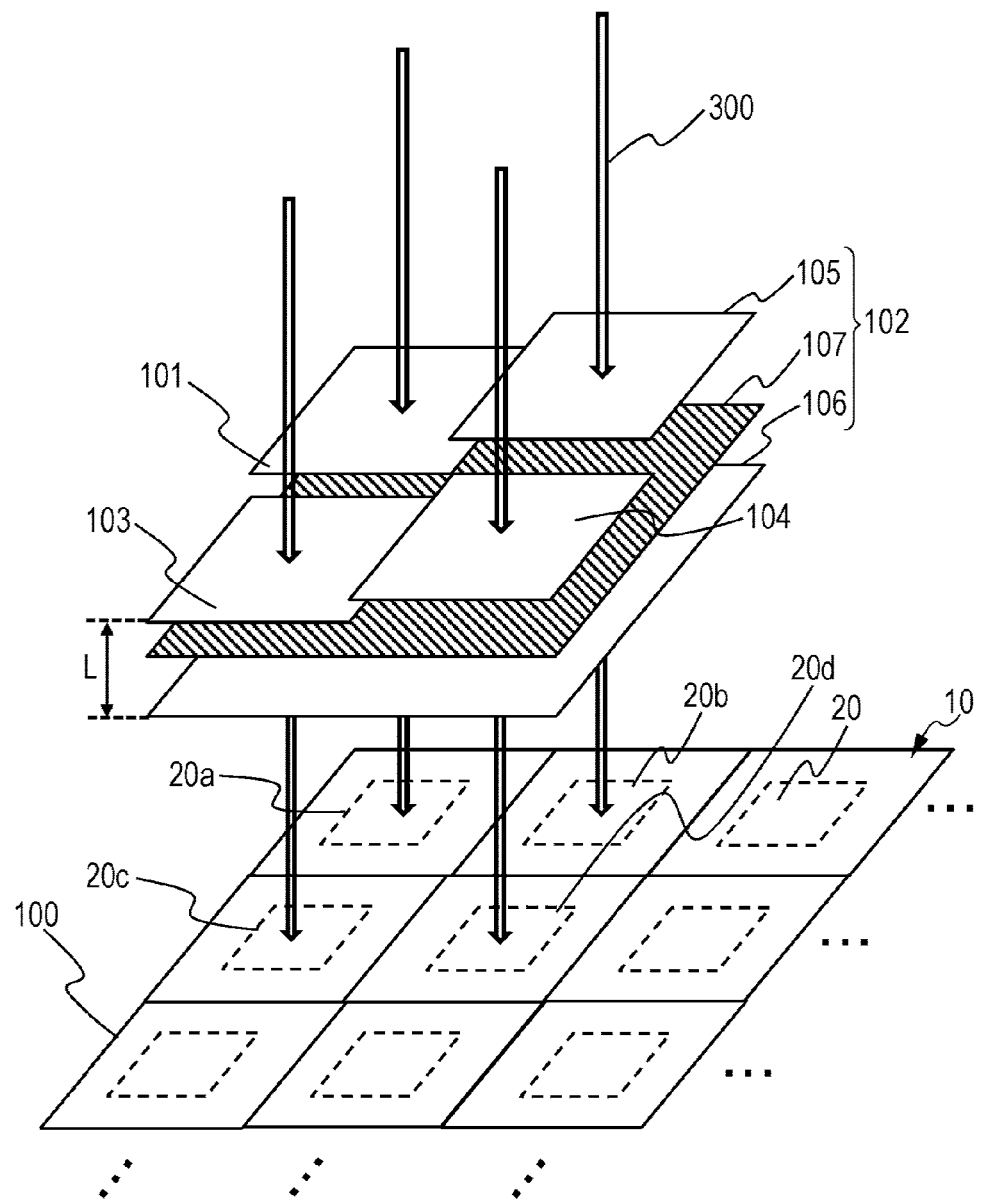
FIG. 1 is a perspective view schematically showing a configuration example of a polarization imaging device of the present disclosure.

FIG. 1 is a perspective view schematically showing a configuration example of a polarization imaging device in a first exemplary embodiment of the present disclosure. The polarization imaging device shown in the drawing comprises: photoelectric conversion element array 100 which defines imaging surface 10; and first polarization imaging element 101 to fourth polarization imaging element 104 which are disposed to face imaging surface 10.

Photoelectric conversion element array 100 in the present exemplary embodiment has a configuration in which a plurality of photoelectric conversion elements 20 are arranged in rows and columns. A typical example of photoelectric conversion element 20 is a photodiode formed in a semiconductor substrate. Each of photoelectric conversion elements 20 generates an electric signal according to a received light amount. Normally, one photoelectric conversion element 20 is assigned to one pixel. For the sake of ease, 3×3=9 pieces of photoelectric conversion elements 20 are illustrated in FIG. 1; however, more photoelectric conversion elements 20 are actually arranged. When each of photoelectric conversion elements 20 is distinguished, photoelectric conversion elements 20 are each referred to as first photoelectric conversion element 20a, second photoelectric conversion element 20b, third photoelectric conversion element 20c, fourth photoelectric conversion element 20d, etc. First polarization imaging element 101 to fourth polarization imaging element 104 correspond to first photoelectric conversion element 20a to fourth photoelectric conversion element 20d, respectively.

Figure 3A:
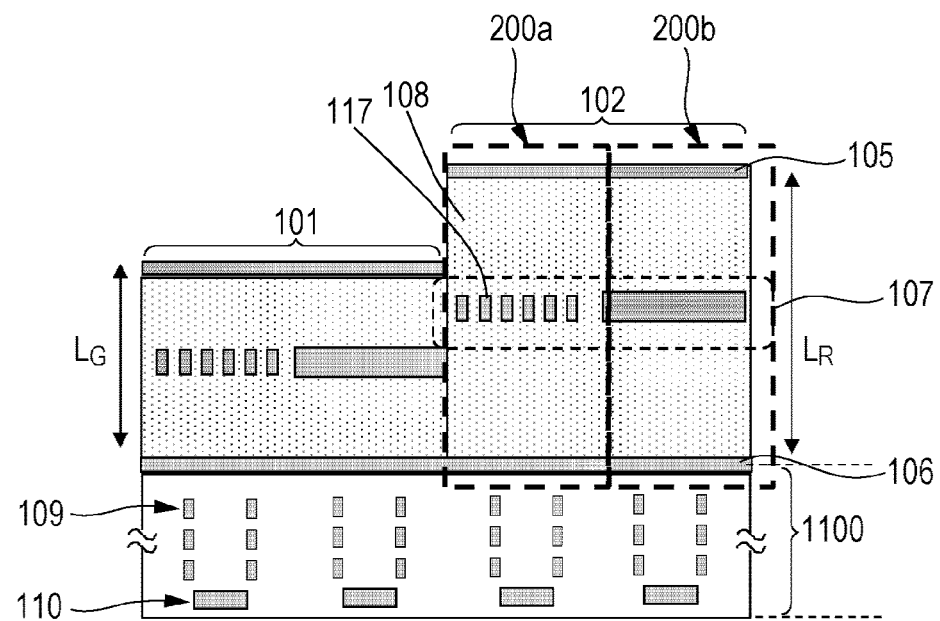
FIG. 3A is a sectional view of the first exemplary embodiment, in which sectional view the cross-section 3A-3A, in FIG. 2B, of the polarization imaging device of the present exemplary embodiment is viewed in the arrow direction.

As shown in FIG. 3A, second polarization imaging element 102 includes first optical filter 200a and second optical filter 200b. First optical filter 200a includes: one sheet of first metal layer 105 disposed parallel to imaging surface 10; one sheet of second metal layer 106 disposed parallel to first metal layer 105; wire grid polarizer 107 provided between first metal layer 105 and second metal layer 106 and at a position away from first metal layers 105 and 106. Second optical filter 200b is similar to first optical filter 200a. Second optical filter 200b is adjacent to first optical filter 200a. There is disposed a dielectric layer between first metal layer 105 and second metal layer 106; however, the dielectric body is not shown in FIG. 1 for the sake of ease.

In this manner, optical filter 200 comprises a Fabry-Perot resonator configured with a laminated structure which includes: one sheet of first metal layer 105; one sheet of second metal layer 106; and a dielectric layer (not shown in FIG. 1). In addition, optical filter 200 comprises one sheet of plate-shaped wire grid polarizer 107.

As shown in FIG. 3A, second metal layer 106 is parallel to first metal layer 105 in the cross-section along the direction of lamination of the laminated structure which constitutes the Fabry-Perot resonator. In the cross-section, dielectric layer 108 is interposed between first metal layer 105 and second metal layer 106. In the cross-section, the one sheet of plate-shaped wire grid polarizer 107 is embedded in dielectric layer 108. It is preferable that the number of wire grid polarizer 107 embedded in dielectric layer 108 is one.

The one sheet of plate-shaped wire grid polarizer 107 comprises three or more metal wire layers 117. In FIG. 3A, the one sheet of plate-shaped wire grid polarizer 107 comprises six metal wire layers 117. These metal wire layers 117 are parallel to one another. The one sheet of plate-shaped wire grid polarizer 107 is parallel to first metal layer 105. In this manner, metal wire layers 117 are parallel to first metal layer 105.

It is preferable that the one sheet of plate-shaped wire grid polarizer 107 is located approximately at a middle between first metal layer 105 and second metal layer 106.

The light having a first polarization plane perpendicular to metal wire layers 117 is transmitted through plate-shaped wire grid polarizer 107. However, the light having a second polarization plane parallel to metal wire layers 117 is blocked by plate-shaped wire grid polarizer 107. It is preferable that a space formed between neighboring two metal wire layers 117 is filled with a dielectric body.

Figure 2A:
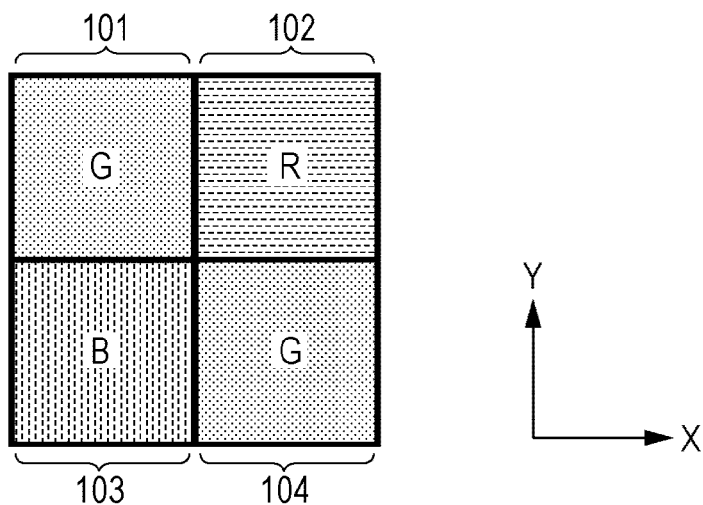
FIG. 2A is a plan view showing an example of a fundamental period unit of a two-dimensional color mosaic array in optical filter 200 of a first exemplary embodiment of the present disclosure.
Figure 2B:
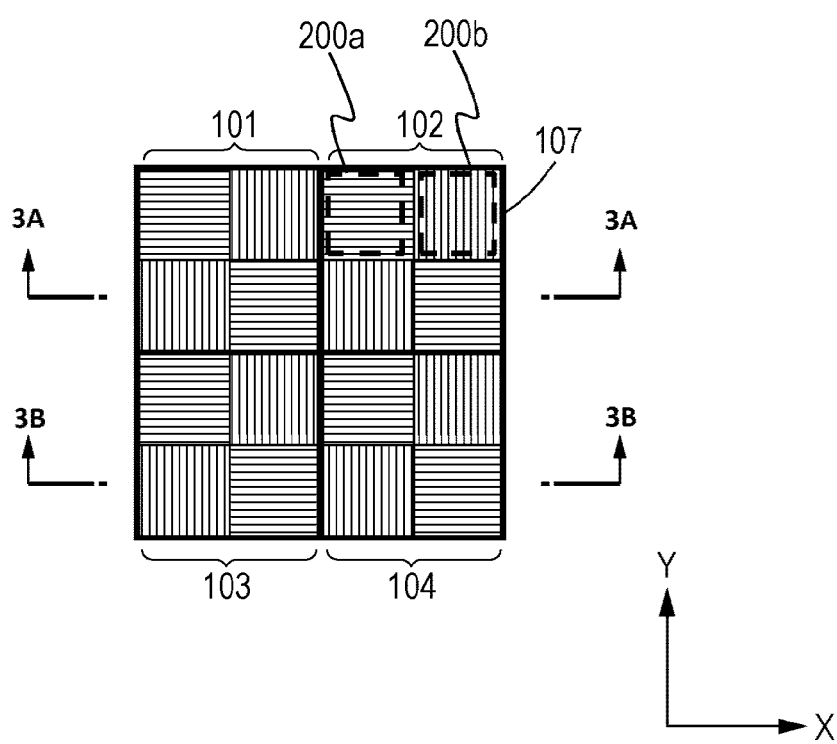
FIG. 2B is a plan view showing a two-dimensional array configuration of a wire grid polarizer included in an area of the fundamental period unit shown in FIG. 2A.

As shown in FIGS. 2A and 2B, in a planer view of the polarization imaging device, a longitudinal direction X of the metal wire layers included in first optical filter 200a may be different from a longitudinal direction Y of the metal wire layers included in second optical filter 200b. It is preferable that longitudinal direction Y is perpendicular to longitudinal direction X.

Figure 10A:
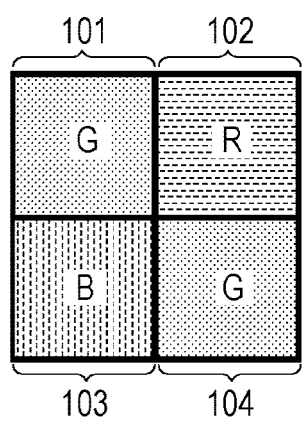
FIGS. 10A and 10B are plan views showing an example of the relationship between a color mosaic array of optical filters and a mosaic array of wire grid polarizers in a fifth exemplary embodiment.
Figure 10B:
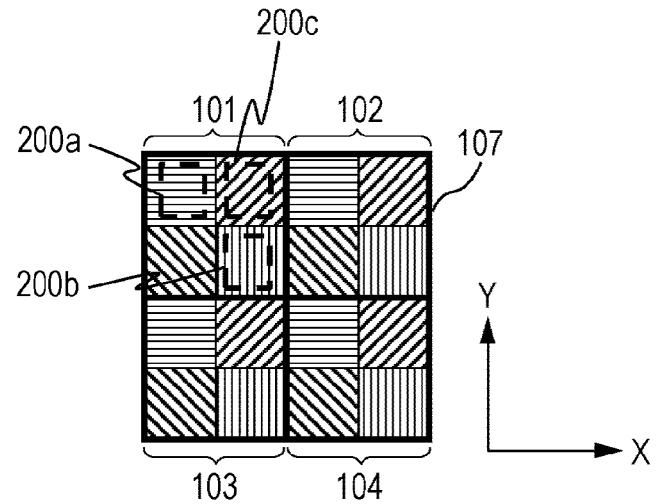

As shown FIGS. 10A and 10B, the polarization imaging element may be further equipped with third optical filter 200c. Third optical filter 200c is similar to first optical filter 200a. As shown in FIGS. 10A and 10B, in a planar view of the polarization imaging device, third optical filter 200c is adjacent to first optical filter 200a or second optical filter 200b. In the planar view, a longitudinal direction of the metal wire layers included in third optical filter 200c is different from both of longitudinal direction X of the metal wire layers included in first optical filter 200a and longitudinal direction Y of the metal wire layers included in second optical filter 200b.

In the example of FIG. 1, second metal layer 106 is a constant distance away from imaging surface 10, but the distances of first metal layers 105 from imaging surface 10 are different for each pixel. Thus, distances L between first metal layers 105 and second metal layer 106 can be different for each pixel. Second metal layer 106 may also be different distance away from imaging surface 10 for each pixel unit as first metal layers 105 are. In that case, the distance of first metal layer 105 from imaging surface 10 may be constant without depending on the pixel.

Light 300 entering optical filter 200 is multiple-reflected between first metal layer 105 and second metal layer 106. As a result, a light component, in a certain wavelength band, of light 300 is able to pass through optical filter 200. In addition, because wire grid polarizer 107 is provided in optical filter 200 in the exemplary embodiment of the present disclosure, a certain polarized light is able to pass through optical filter 200 due to a function of wire grid polarizer 107. Wire grid polarizer 107 has a configuration in which a plurality of polarizers are arranged such that the polarization property is different for each pixel or for each larger unit including a plurality of pixels. In the example of FIG. 1, wire grid polarizer 107 is a constant distance away from imaging surface 10 for the sake of ease; however, the wire grid polarizer of the present disclosure is not limited to such an example. The distance of wire grid polarizer 107 from imaging surface 10 can have different values for each pixel or for each of units larger than pixels. Wire grid polarizer 107 can be formed, typically by patterning a metal thin film by a photolithography technique and an etching technique.

The wavelength band and the direction of the polarization plane of the polarized light passing through optical filter 200 can be adjusted, for each pixel, corresponding to the position of optical filter 200. The example of FIG. 1 illustrates that all the areas, of optical filter 200, facing the pixels have first metal layer 105, second metal layer 106, and wire grid polarizer 107; however, an area corresponding to a certain pixel does not need to be provided with a part of first metal layer 105, second metal layer 106, and wire grid polarizer 107.

The arrangement of photoelectric conversion elements 20 on imaging surface 10 is not limited to the arrangement shown in FIG. 1, and the central position of the photoelectric conversion elements may be shifted by a half pixel pitch row by row, for example.

Next, refer to FIG. 2A and FIG. 2B. FIG. 2A shows an example of a unit of fundamental period of a two-dimensional color mosaic array in optical filter 200. On the other hand, FIG. 2B shows a two-dimensional array configuration of the wire grid polarizers included in the area of the unit of fundamental period of FIG. 2A. In the actual polarization imaging device, the units of fundamental period shown in FIG. 2A and FIG. 2B are cyclically arranged in the row direction and the column direction along a plane parallel to the imaging surface.

The color mosaic array shown in FIG. 2A has a configuration of a Bayer array; however, the color mosaic array in the present exemplary embodiment may have a different configuration. The unit of fundamental period of the color mosaic array shown in the drawing is configured with four color areas arranged in two rows and two columns, in other words, configured with G area 101, R area 102, B area 103, and G area 104. G area 101, R area 102, and B area 103 are defined as areas which selectively transmit lights in a green wavelength band, a red wavelength band, and a blue wavelength band, respectively.

FIG. 2B shows 4×4=16 pieces of wire grid polarizers of wire grid polarizers 107. The 16 pieces of wire grid polarizers are categorized into two types, depending on the directions of the polarization transmission surfaces. There are provided 2×2=4 pieces of wire grid polarizers in each color area of the color mosaic array. In more detail, wire grid polarizers whose wire directions are lateral (0° angle direction with respect to an X-axis) and wire grid polarizers whose wire directions are vertical (90° angle direction with respect to the X-axis) are arranged in two rows and two columns in each color area.

Figure 3B:
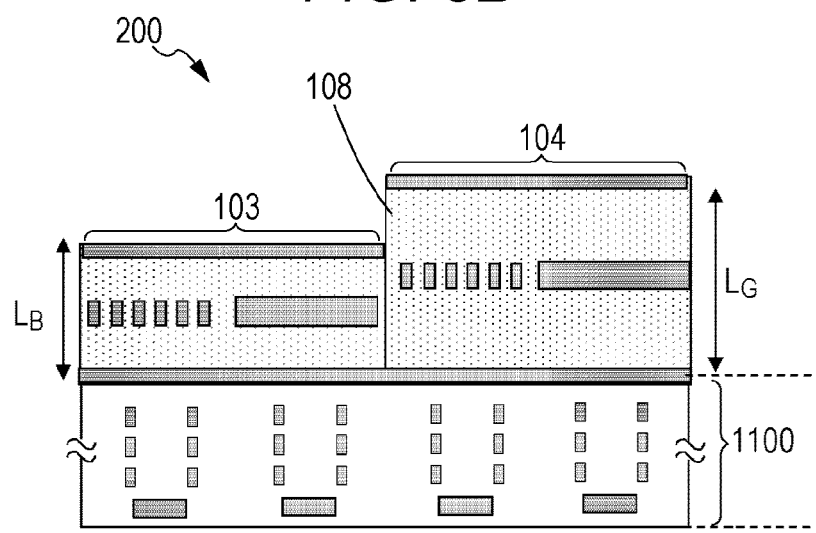
FIG. 3B is a sectional view of the first exemplary embodiment, in which sectional view the cross-section 3B-3B, in FIG. 2B, of the polarization imaging device of the present exemplary embodiment is viewed in the arrow direction.

FIG. 3A is a sectional view in which the cross-section 3A-3B, in FIG. 2B, of the polarization imaging device of the present exemplary embodiment is viewed in the arrow direction, and FIG. 3B is a sectional view in which the cross-section 3B-3B, in FIG. 2B, of the polarization imaging device of the present exemplary embodiment is viewed in the arrow direction. FIG. 3A shows a cross-sectional configuration of G area 101 and R area 102 of optical filter 200, and FIG. 3B shows a cross-sectional configuration of B area 103 and G area 104 of optical filter 200.

Optical filter 200 shown in the drawings comprises first metal layer 105, second metal layer 106, dielectric body 108, and wire grid polarizer array 107. First metal layer 105 and second metal layer 106 are each formed of a metal thin film having a thickness thin enough to transmit visible light. On the other hand, wire grid polarizer array 107 is formed of a patterned thin film of conductive material and is configured with a plurality of metal wires extending in different directions for each pixel or for each unit larger than a pixel.

Because wire grid polarizers included in wire grid polarizer 107 are arranged one another such that the directions of the conductive wires of the wire grid polarizers are perpendicular to each other as shown in FIG. 2B, FIG. 3A shows that the wire grid polarizers have two types of cross-sectional shapes. Although the same material is used for the areas of R, G, and B, dielectric bodies 108 have different thickness in each color area. That is to say, the distances between first metal layers 105 and second metal layer 106 have a plurality of different values $L_R$, $L_G$, and $L_B$ in the areas of R, G, and B, respectively.

Two metal layers 105 and 106 facing each other with dielectric body 108 in between form Fabry-Perot interferometer type color filters for each of the areas of R, G, and B, and selectively transmit only the light in the wavelength bands of R, G, and B, respectively. In addition, the effect of wire grid polarizer array 107 allows the light (TM wave) having an electric field oscillating in the direction perpendicular to the wire direction to selectively pass through, as described later.

Under second metal layer 106 is provided solid-state image sensor structure 1100. Solid-state image sensor structure 1100 comprises wiring layers 109 and photodiodes 110. As described above, photodiodes 110 are regularly arranged, on a plane parallel to the imaging surface, in the row direction and the column direction. Each photodiode 110 constitutes a pixel to output an electric signal corresponding to an amount of incident light. Distances $L_R$, $L_G$, and $L_B$ are some 10 nm to some 100 nm and are sufficiently small compared to the thickness (some 100 μm) of solid-state image sensor structure 1100. First metal layers 105 and second metal layer 106 have a thickness which is thin enough for light to pass through and is 10 nm to 40 nm when Ag is used, for example.

In the present exemplary embodiment, one photodiode 110 is given to each wire grid polarizer included in wire grid polarizer array 107. In other words, one photodiode 110 is given to each of the 4×4=16 pieces of wire grid polarizers shown in FIG. 2B.

Figure 4A:
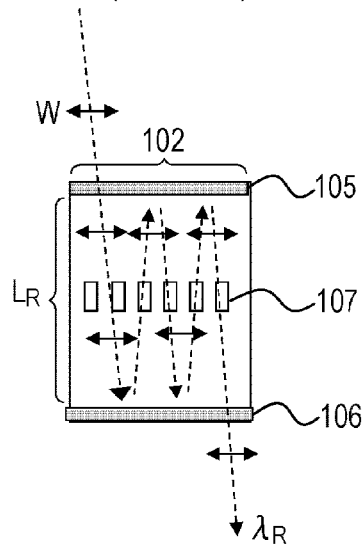
FIG. 4A is a sectional view showing a state of transmission and reflection of light when a P-polarized light enters an optical filter of the polarization imaging device of the first exemplary embodiment.

FIG. 4A is a diagram showing an operation in the polarization imaging device in the exemplary embodiment of the present disclosure when there enters white light W having a P wave (TM wave), in other words, white light W having electric field oscillation parallel to the paper surface of the drawing. The drawing shows the operation in one pixel on the left part of R area 102 in FIG. 3A. The incident wave of white light W passes through first metal layer 105 from above and reaches wire grid polarizer array 107. The wire direction of the wire grid polarizer shown in FIG. 4A is parallel to the cross-section (paper surface). Thus, most of the P-wave as the incident light passes through wire grid polarizer array 107, reaches second metal layer 106, and is reflected. Because this reflected light is also the P-wave (TM wave), most of the reflected light passes through wire grid polarizer array 107 and reaches first metal layer 105 again. After such reflection is repeated, only the P-polarized (TM wave) light having a resonance wavelength AR whose integral multiples are equal to the optical path difference is finally transmitted through second metal layer 106 due to the principle of the Fabry-Perot interferometer and is emitted downward.

The above operation can be thought as the operation of the color polarizing filter, in which P-polarized white light is transmitted to become R (Red) light with P-polarization unchanged. According to the theory of the Fabry-Perot interferometer, the above-described resonance wavelength AR is expressed by the following equation, when the incident angle is zero, using the refractive index n and the length $L_R$ of the dielectric body and the order m.

$$\lambda_R = \frac{2nL_R}{m} \qquad \text{[Mathematical Expression 1]}$$

Figure 4B:
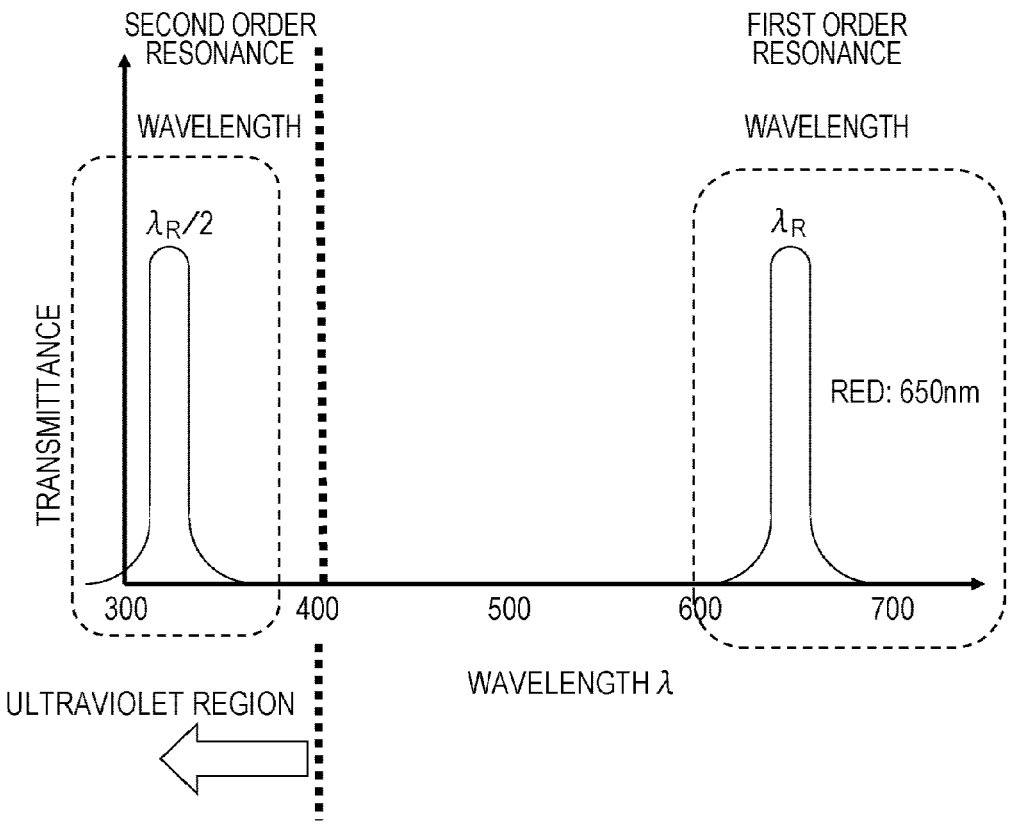
FIG. 4B is a diagram showing a wavelength distribution of a P-polarized light which passes through the optical filter.

For example, assuming that the dielectric body is made of SiO$_2$, refractive index is n=1.45, and the length is L$_R$=220 nm, the first order resonance wavelength of m=1 is calculated to be 638 nm; thus, the optical filter functions as a color filter which transmits Red light. In this case, the second order resonance wavelength of m=2 is 319 nm, which is in the ultraviolet region, and is negligible when the optical filter is used as a color filter. FIG. 4B is a diagram schematically showing a wavelength distribution of the light passing the color filter having the configuration of FIG. 4A.

Note that Expression 1 is an approximate expression in which absorption in the metal layer is ignored. Actually, optical filter 200 can be realized to have L$_R$=160 nm, and in optical filter 200 metal layers 105 and 106 are made up of Ag thin films and dielectric body 108 is formed of SiO$_2$.

Figure 5A:
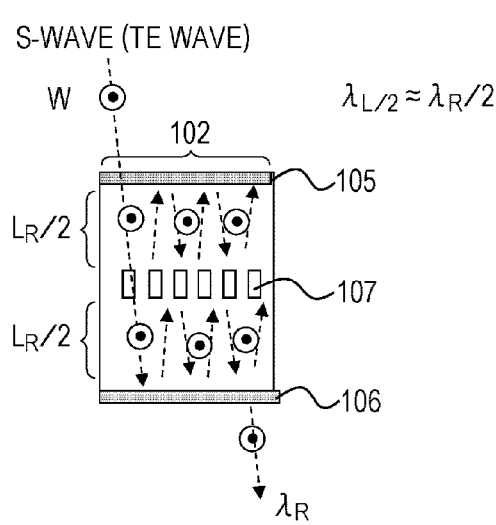
FIG. 5A is a sectional view showing a state of transmission and reflection of light when an S-polarized light enters the optical filter of the polarization imaging device of the first exemplary embodiment.
Figure 5B:
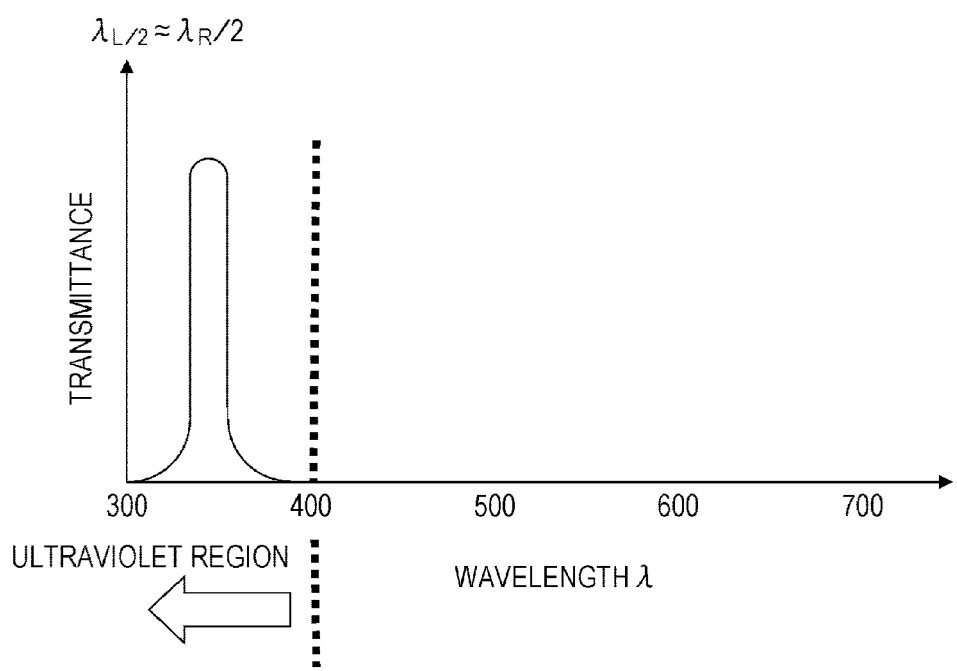
FIG. 5B is a diagram showing a wavelength distribution of an S-polarized light which passes through the optical filter.

FIG. 5A is a diagram showing an operation in the sectional view of the polarization imaging device in the exemplary embodiment of the present disclosure when there enters white light W having an S-wave (TE wave), in other words, white light W having electric field oscillation perpendicular to the paper surface. In the same way as in FIG. 4A, shown is the operation in one pixel on the left part of R area 102 in FIG. 3A. The incident light passes through first metal layer 105 from above and reaches wire grid polarizer array 107, and because the wire directions of the wire grid polarizer shown in FIG. 5A is perpendicular to the cross-section (paper surface), most of the S-wave as the incident light is reflected on the wire grid polarizer, reaches first metal layer 105, and is reflected again. Because this reflected light is also an S-wave (TE wave), the reflected light is multiple-reflected between first metal layer 105 and wire grid polarizer 107. Actually, some component passes through wire grid polarizer array 107; however, because the transmitted light is also an S-polarized light (TE wave), multiple-reflection occurs in a gap of a length L$_R$/2 between wire grid polarizer 107 and metal layer 106. As a result, only the S-polarized light having the resonance wavelength $\lambda \approx \lambda R/2$, which is the half of the intended L$_R$, finally passes through second metal layer 106 and is emitted downward. However, the transmitted light is negligible because the wavelength falls in the ultraviolet region as shown in FIG. 5B similarly to the case of the order m=2 (FIG. 3B). As a result, the optical filter is thought to function as color polarizing filter which blocks S-polarized light in the visible light region when S-polarized (TE wave) white light enters.

Next, by using a simple example, there will be described an action in which a low extinction ratio is improved when light passes through wire grid polarizer 107 many times due to multiple-reflection.

Assuming that the transmittance Pt and the reflectance Pr of the wire grid are Pt=0.95 and Pr=0.05 when a P-wave enters as shown in FIGS. 4A and 4B. Further, assuming that the transmittance Pt and the reflectance Pr of the wire grid are St=0.095 and Sr=0.905 when an S-wave enters as shown in FIGS. 5A and 5B. In this case, the extinction ratio is calculated to be 10:1 as below, and it has to be said that the ratio is very low when compared to a high performance polarizer.

$$\frac{P_t}{S_t} = \frac{0.95}{0.095} = 10 \qquad \text{[Mathematical Expression 2]}$$

However, when the light is multiple-reflected in the Fabry-Perot interferometer type color filter, the amount of the light multiple-reflected in the distance L$_R$, which corresponds to the transmitted wavelength $\lambda$R, is expressed by the following mathematical expression, where the transmission is t.

$$T = \lim_{n \to \infty} (t + t^3 + t^5 + \ldots + t^{2n-1}) = \frac{t}{1-t^2} \qquad \text{[Mathematical Expression 3]}$$

As a result, by using the P light and the S light of the finally transmitted light, the extinction ratio is expressed as follows.

$$\frac{PP_t}{SS_t} = \frac{0.95/(1-0.95)^2}{0.095/(1-0.095)^2} = 101 \qquad \text{[Mathematical Expression 4]}$$

Thus, the extinction ratio can be improved from 10:1 to about 101:1.

With the configuration of the polarization imaging device of the present exemplary embodiment, when any non-polarized white light enters, the color selection operation and at the same time the polarization operation are integrally realized due to the above-described operation, and in addition, the extinction ratio of polarization can be improved.

Second Exemplary Embodiment

Next, a second exemplary embodiment of a polarization imaging device of the present disclosure will be described.

Figure 6A:
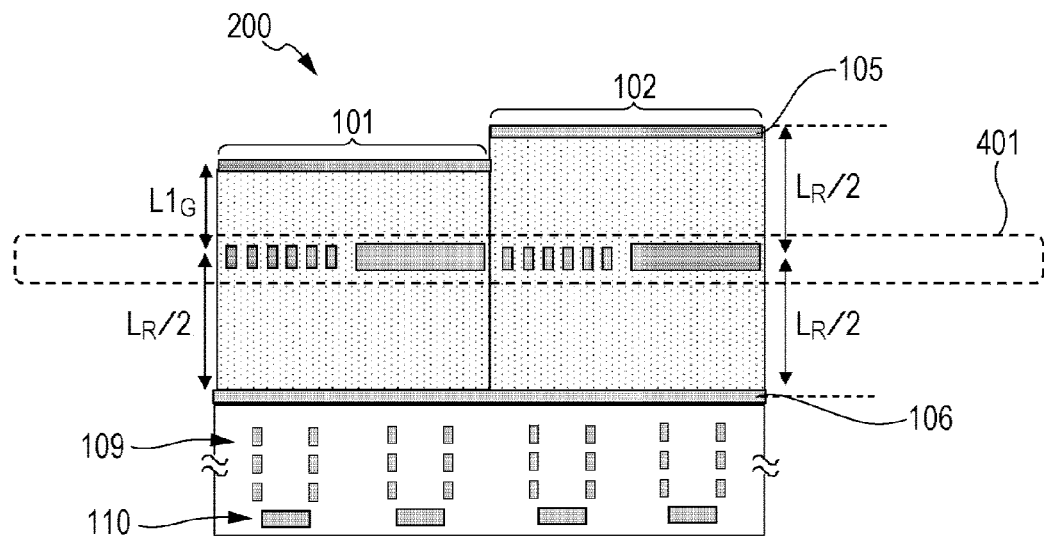
FIG. 6A is a sectional view of a polarization imaging device, in which sectional view the cross-section 3A-3A, in FIG. 2B, of a second exemplary embodiment is viewed in the arrow direction.
Figure 6B:
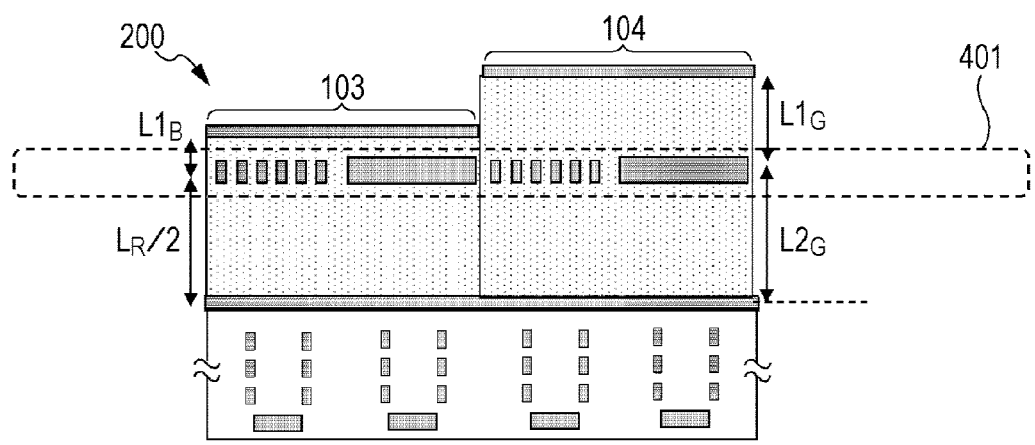
FIG. 6B is a sectional view in which the cross-section 3B-3B is viewed in the arrow direction.

FIG. 6A and FIG. 6B are partial sectional views of the polarization imaging device in the present exemplary embodiment. As shown in FIG. 6A and FIG. 6B, the difference of the present exemplary embodiment from the first exemplary embodiment is that wire grid polarizer 401 is located on the same level in a plurality of different color areas. That is to say, the distance between wire grid polarizer 401 and second metal layer 106 is the same. Because wire grid polarizer 401 is on the same level, the production process is simple as described later.

In the example shown in the drawings, the height of wire grid polarizer 401 is set to be L$_R$/2, which is the position of approximately ½ of a filter length for the R pixel.

Because the wavelength corresponding to this length falls in the ultraviolet region, which is not longer than 400 nm, the length L1$_G$ and L1$_B$, which are unevenly divided in G areas 101 and 104 and B area 103, all satisfy the condition shown in the following Mathematical Expression 5. Thus, unnecessary resonance wavelengths are all in the ultraviolet region also for G areas 101 and 104 and B area 103. As a result, the function as an RGB color filter is well performed, whereby color separation can be normally realized. In addition, the advantageous effect of improvement of the extinction ratio of wire grid polarizer 401 can also be obtained similarly to the first exemplary embodiment.

$$L1_G < L_R/2$$

$$L1_B < L_R/2 \qquad \text{[Mathematical Expression 5]}$$

First Modified Example of Second Exemplary Embodiment

Figure 7A:
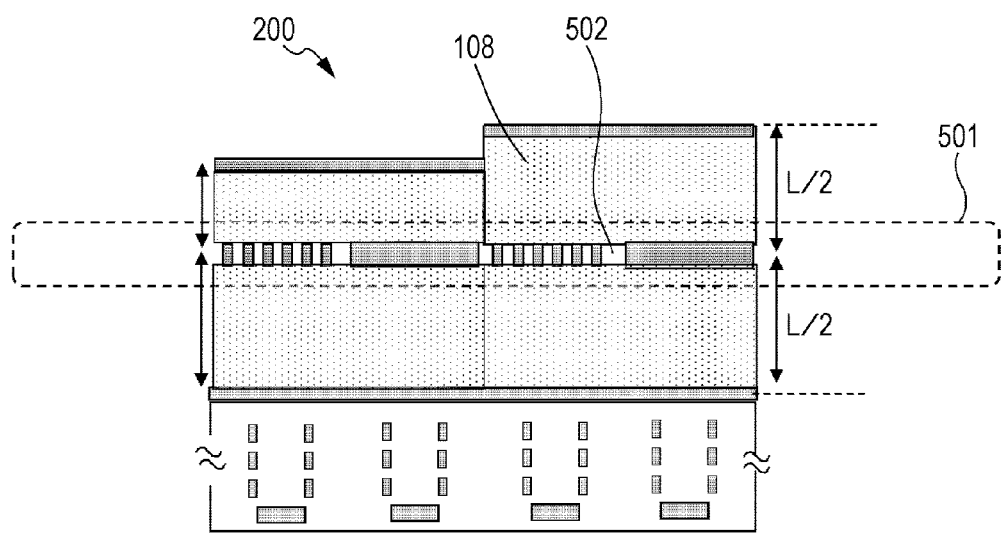
FIG. 7A is a sectional view of the second exemplary embodiment, in which sectional view the cross-section 3A-3A, in FIG. 2B, of a polarization imaging device in a first modified example is viewed in the arrow direction.
Figure 7B:
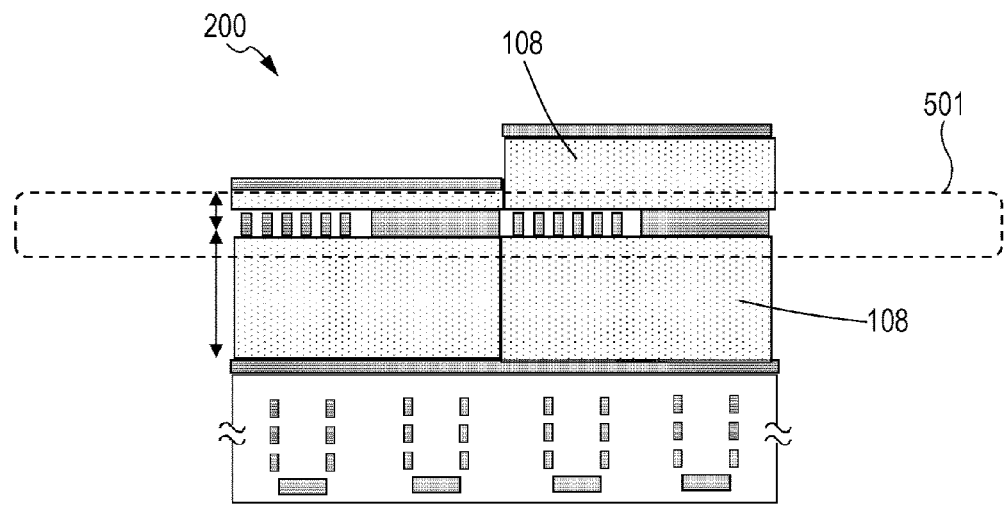
FIG. 7B is a sectional view in which the cross-section 3B-3B is viewed in the arrow direction.

FIG. 7A and FIG. 7B are sectional views of a polarization imaging device of a first modified example in the second exemplary embodiment. Also in this modified example, a color image and a polarized light image can be simultaneously obtained in the same manner as in the first exemplary embodiment. As shown in FIG. 7A and FIG. 7B, the difference of this modified example from the second exemplary embodiment is that wire grid polarizer 501 is formed in gap layer 502 in dielectric body 108. When gap layer 502 is filled with air, because the conductive wires of wire grid polarizer 501 are in contact with air, the extinction ratio performance of wire grid polarizer 501 can be further improved.

Third Exemplary Embodiment

Figure 8A:
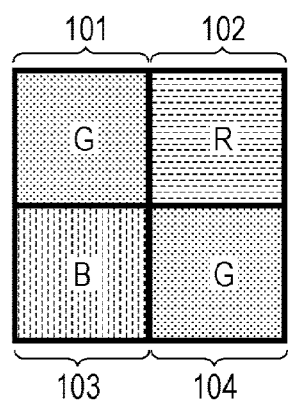
FIG. 8A and FIG. 8B are plan views showing the relationship between a color mosaic array of optical filters and a mosaic array of wire grid polarizers of a polarization imaging device in a third exemplary embodiment.
Figure 8B:
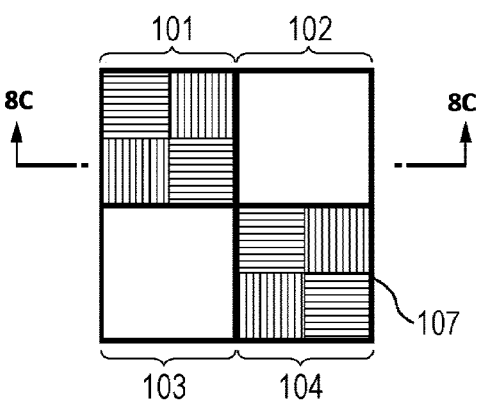
Figure 8C:
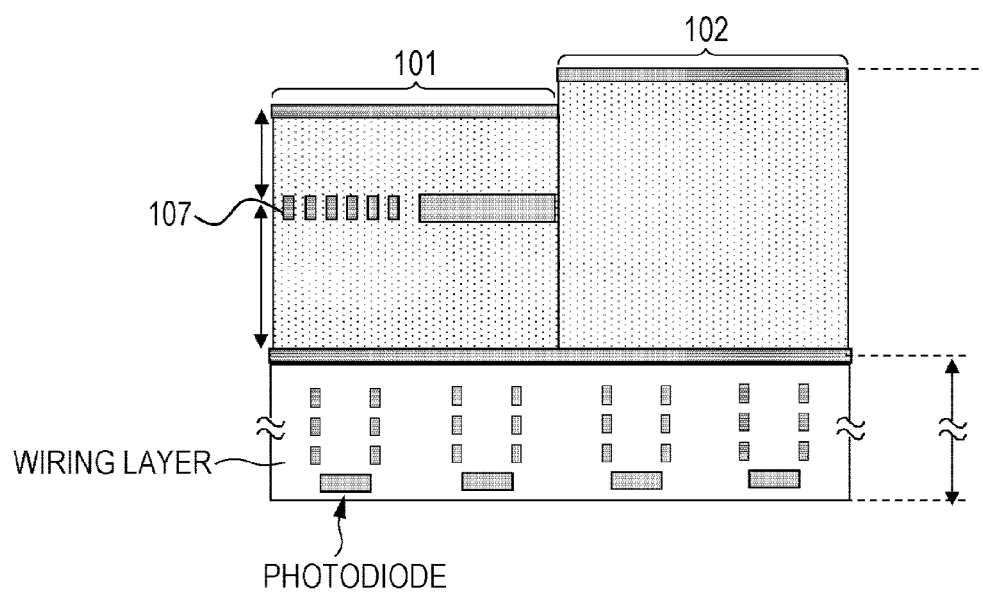
FIG. 8C is a sectional view cut along the line 8C-8C in FIG. 8B.
Figure 9A:
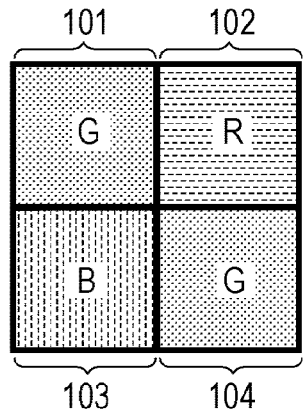
FIGS. 9A, 9B, 9C, and 9D are each a plan view showing the relationship between a color mosaic array of optical filters and a mosaic array of wire grid polarizers in a fourth exemplary embodiment.
Figure 9B:
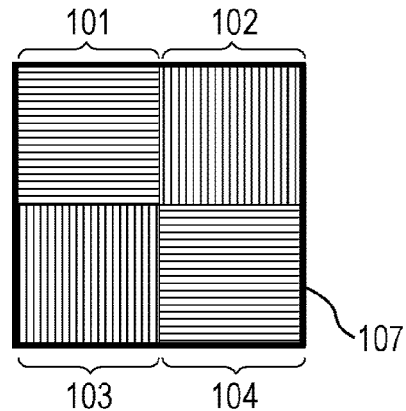
Figure 9C:
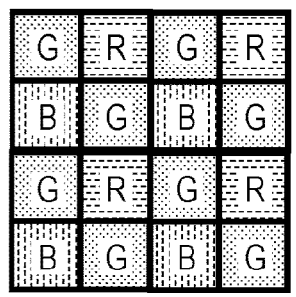
Figure 9D:
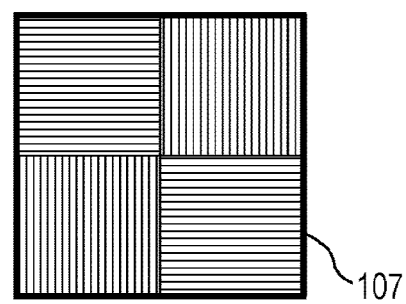

Next, a third exemplary embodiment of a polarization imaging device of the present disclosure will be described. FIG. 8A and FIG. 8B are partial plan views of the polarization imaging device of the present exemplary embodiment, and FIG. 8C is a sectional view along the line 8C-8C in FIG. 8B. FIG. 8A shows an example of a unit of fundamental period of a two-dimensional color mosaic array of optical filter 200. On the other hand, FIG. 8B shows a two-dimensional array configuration of the wire grid polarizers included in an area of the unit of fundamental period of FIG. 8A. In an actual polarization imaging device, the unit of fundamental period shown in FIG. 8A and FIG. 8B is cyclically arranged, along a plane parallel to the imaging surface, in the directions of row and column. With the present exemplary embodiment, a color image and a polarized light image in G areas 101 and 104 can be simultaneously obtained. The configuration of the present exemplary embodiment is beneficial in obtaining a polarized light image only from a specific wavelength area.

As shown in FIG. 8A, also in the present exemplary embodiment, the unit of fundamental period of the color mosaic array is configured with G area 101, R area 102, B area 103, and G area 104. However, as shown in FIG. 8B, of areas 101, 102, 103, and 104, the wire grid polarizers are provided only in G areas 101 and 104, and no wire grid polarizer is provided in other color areas, that is, R area 102 and B area 103. In more detail, in each of G areas 101 and 104, the wire grid polarizers having the wire direction of lateral (0°) and the wire grid polarizers having the wire direction of vertical (90°) are arranged one another in two rows and two columns.

FIG. 8C shows G area 101 and R area 102 of optical filter 200. As apparent in the drawing, R area 102 is not equipped with a wire grid polarizer. The R area corresponds to a fourth polarization optical element which is not equipped with a wire grid polarizer. By employing such a configuration, it is possible to maintain the brightness of a color image and at the same time to obtain polarized light information. In this exemplary embodiment, only the G areas are disposed with wire grid polarizers and none of the R area and the B area is disposed with a wire grid polarizer; however, it is arbitrary which of the color areas a wire grid polarizer is disposed on. For example, it is possible to dispose wire grid polarizers only on the R areas and not on the G areas or the B areas, or alternatively, it is possible to dispose wire grid polarizers only on the B areas and the G areas and not on the R areas. If none of a second polarization optical element and a third polarization optical element is disposed, the fourth polarization optical element is sometimes referred to as a second polarization optical element as a matter of form.

Fourth Exemplary Embodiment

FIGS. 9A to 9D are diagrams showing two examples of a planner configuration of an optical filter in the polarization imaging device of the present exemplary embodiment. In the present exemplary embodiment, the correspondence between the Bayer color mosaic configuration and the wire grid polarizer mosaic configuration is different from the correspondence in the above-described exemplary embodiment. In the above-described exemplary embodiment, the mosaic made up of a plurality of wire grid polarizers, specifically speaking, a mosaic in a 2×2 configuration made up of two types of wire grid polarizers corresponds to the same single color area. However, in the example of FIG. 9A and FIG. 9B, a mosaic pixel of one type of wire grid polarizer corresponds to a color pixel of one type in the color mosaic. In other words, each of the wire grid polarizers is disposed to correspond to one color filter area of a plurality of color filter areas. Alternatively, in the example of FIG. 9C and FIG. 9D, a plurality of color mosaic areas, specifically, an area in three colors made up of 2×2 pixels corresponds to a mosaic pixel made up of one type of wire grid polarizer. In other words, each of the wire grid polarizers corresponds to a plurality of color filter areas. An object of these examples is to improve color resolution, and the examples have an advantage that, when the image to be picked-up is a non-polarized scene, a high resolution color image can be obtained.

Fifth Exemplary Embodiment

FIGS. 10A and 10B, FIGS. 11A and 11B, and FIGS. 12A and 12B are diagrams showing other examples of a planar configuration of an optical filter in the polarization imaging device of the present exemplary embodiment. In any one of the above-described exemplary embodiments, the arrangement directions are only two, which are the 0° direction with respect to an X-axis and the 90° direction with respect to the X-axis. This arrangement is based on the assumption that an angle of the polarization of an image to be picked-up is 0° or 90°. This is because the polarization imaging device is supposed to be used in the following cases: that a polarized illumination having a polarization transmission surface of 0° or 90° is always used at a time of imaging as in the case of an endoscope, which performs polarizing imaging; and that, as in the case of an on-vehicle camera, the polarization imaging device is fixed at 0°, at which the reflected light from a rainy road surface is approximately horizontal.

Figure 11A:
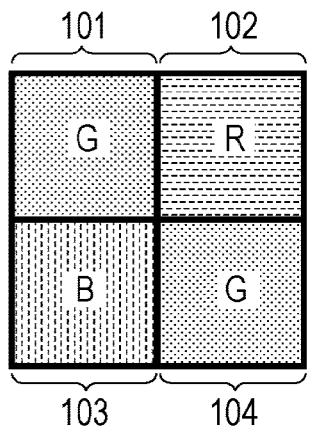
FIGS. 11A and 11B are plan views showing another example of the relationship between the color mosaic array of optical filters and the mosaic array of wire grid polarizers in the fifth exemplary embodiment.
Figure 11B:
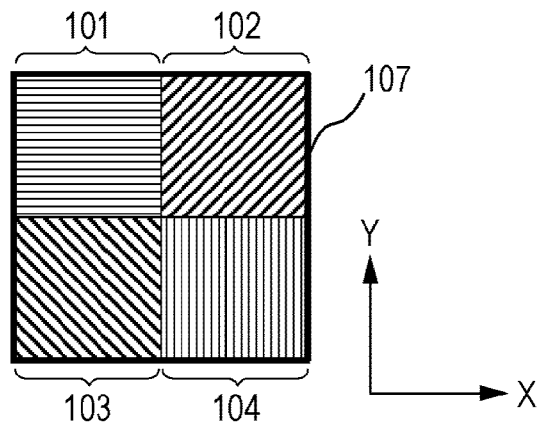
Figure 12A:
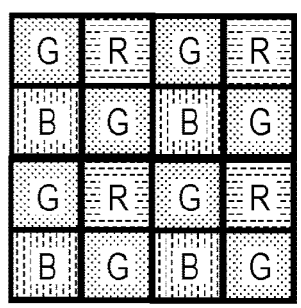
FIGS. 12A and 12B are plan views showing still another example of the relationship between the color mosaic array of optical filters and the mosaic array of wire grid polarizers in the fifth exemplary embodiment.
Figure 12B:
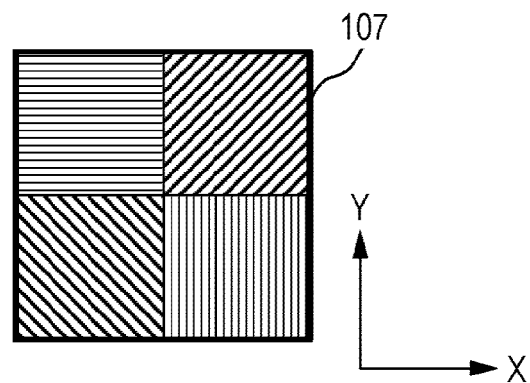

In view of the above cases, in the present exemplary embodiment, the wire grid polarizers have four directions of 0°, 45°, 90°, and 135° with respect to an X-axis. In the example of FIG. 10A and FIG. 10B, a mosaic in a 2×2 pixel configuration made up of four types of wire grid polarizers corresponds to one color area of the color mosaic. In the example of FIG. 11A and FIG. 11B, one wire grid polarizer corresponds to one color area of the color mosaic. In the example of FIG. 12A and FIG. 12B, a color area in three colors constituted by the 2×2 pixels corresponds to each of the wire grid polarizers.

Because wire directions of the wire grid polarizers are set in four different directions in the present exemplary embodiment, the present exemplary embodiment has an advantage that it is possible to accurately estimate the main axis of polarized light and polarization degree even in the scene imaged under a non-polarized (randomly polarized) light source.

Sixth Exemplary Embodiment

Figure 13A:
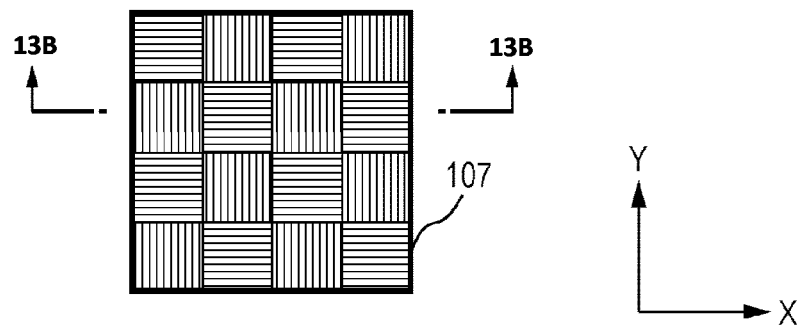
FIG. 13A is a plan view showing an example of a mosaic array of wire grid polarizers in an optical filter of a sixth exemplary embodiment.
Figure 13B:
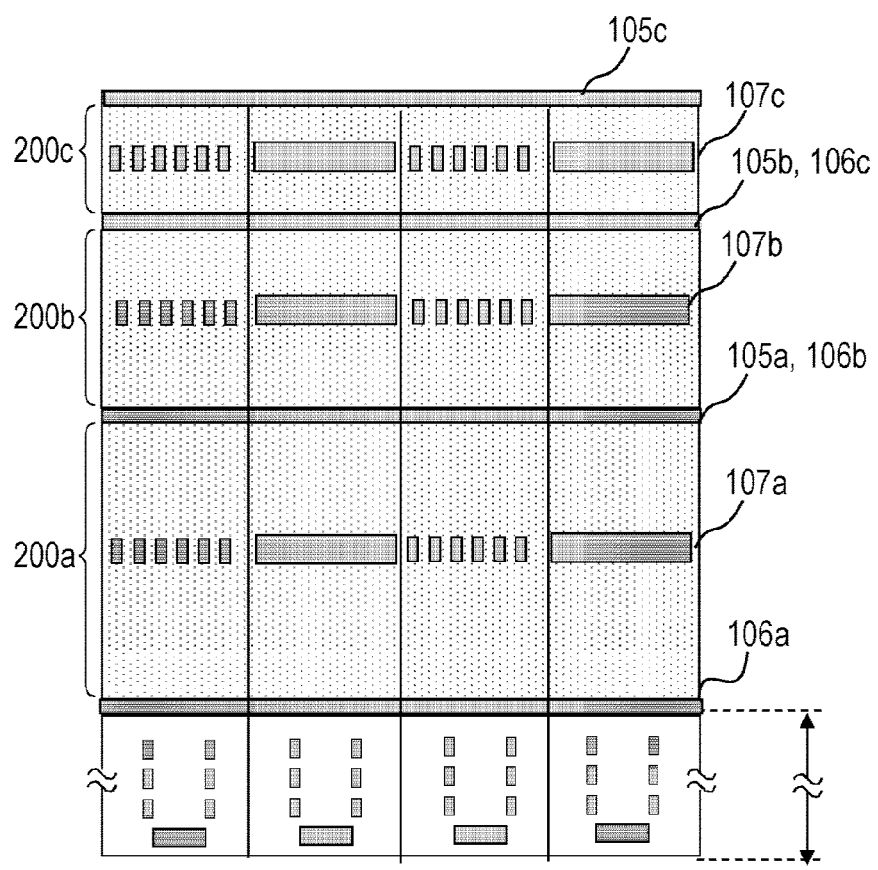
FIG. 13B is a sectional view cut along the line 13B-13B in FIG. 13A.

FIG. 13A is an upper surface view of a polarization imaging device in the present exemplary embodiment, and FIG. 13B is a sectional view of the polarization imaging device. The present exemplary embodiment provides an imaging element which can simultaneously obtain a monochrome image having a broad spectral transmittance and polarized light images in a 0° direction and a 90° directions with respect to an X-axis. For this purpose, different from the already-described exemplary embodiments, the imaging element of the present exemplary embodiment has a configuration in which there are laminated three optical filters 200a, 200b, and 200c, each of which functions as a Fabry-Perot interferometer type color filter, but does not has a color mosaic configuration. Each of optical filters 200a, 200b, and 200c comprises a basic configuration of optical filter 200 as described above. However, first metal layer 105a in optical filter 200a also serves as second metal layer 106b in optical filter 200b. Further, first metal layer 105b in optical filter 200b also serves as second metal layer 106c of optical filter 200c. Each of optical filters 200a, 200b, and 200c contain therein each of wire grid polarizers 107a, 107b, and 107c, respectively. The wire directions of wire grid polarizers 107a, 107b, and 107c are the same in the vertical direction, in which grid polarizers 107a, 107b, and 107c are stacked.

A transmission wavelength band of the Fabry-Perot interferometer type color filter in each of optical filters 200a, 200b, and 200c can be different depending on the distance between a first metal layer and a second metal layer of each optical filter. The transmission wavelength bands of optical filters 200a, 200b, and 200c laminated in the vertical direction may be different or may be the same.

In the present exemplary embodiment, a monochrome image is obtained, and at the same time, the extinction ratio of a wire grid polarizer can be improved.

In the exemplary embodiment of the present disclosure, an array of wire grid polarizers is used as a polarizer located approximately at a middle between the first metal layer and the second metal layer. As described above, in the case of a wire grid polarizer, miniaturization can solve the issue of decrease in the extinction ratio; however, the present disclosure can also work well if the polarizer is replaced by a polarizer based on other principles than the principle of a wire grid. Therefore, the polarizer array of the present disclosure may be configured with, for example, polymer (high molecular) polarization control elements, polarizing elements using birefringence, polarizing elements using wavelength plates, polarizing elements using photonic crystals, or other polarizing elements. Further, these polarization control elements and wire grid polarizers may be located together approximately at the middle between the first metal layer and the second metal layer.

(Method for Manufacturing Color Polarization Imaging Device)

In the following, with reference to FIG. 14A to FIG. 16D, an example of a method for manufacturing the polarization imaging device of the present exemplary embodiment will be described. Here, the polarization imaging device in the second exemplary embodiment is manufactured; however, the other exemplary embodiments can be manufactured by a similar method.

Figure 14A:
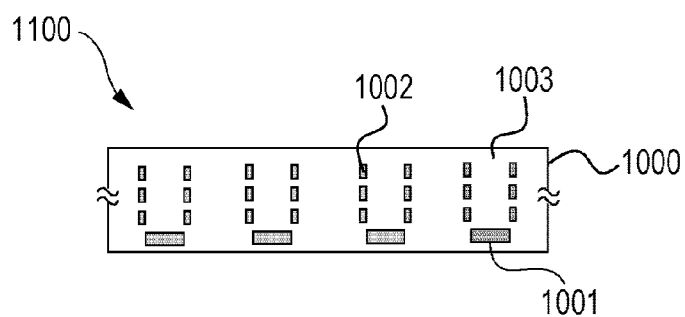
FIG. 14A to FIG. 14D are process sectional views showing a part of an example of a method for manufacturing the polarization imaging device of the second exemplary embodiment.

First, solid-state image sensor structure 1100 shown in FIG. 14A is prepared. This solid-state image sensor structure 1100 includes: substrate 1000 formed of Si; photodiodes 1001 provided in substrate 1000; wiring layers 1002 formed on substrate 1000 through interlayer films; and light transmissive planarizing layer 1003 which covers wiring layer 1002. However, a specific configuration of solid-state image sensor structure 1100 is not limited to this example and is arbitrary.

Figure 14B:
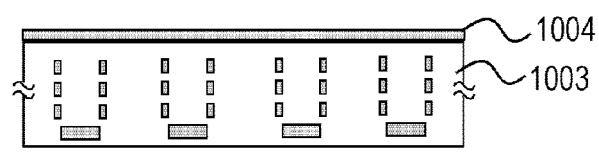

Next, as shown in FIG. 14B, on planarizing layer 1003 is formed metal layer 1004 made of, for example, Al (aluminum) or Ag (silver). Metal layer 1004 is formed by, for example, a thin film deposition technique such as sputtering method, and a thickness of metal layer 1004 can be in a range, for example, from 10 nm to 40 nm. Metal layer 1004 functions as the second metal layer.

Figure 14C:
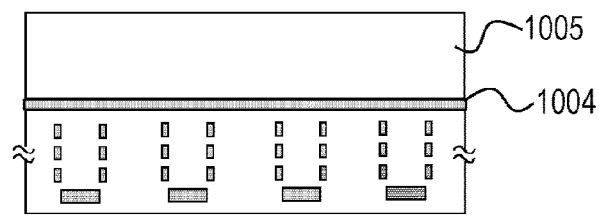

Next, as shown in FIG. 14C, on metal layer 1004 is formed first dielectric layer 1005. First dielectric layer 1005 is formed by a thin film deposition technique such as plasma CVD method, and can be typically formed of $TiO_2$, ITO, SiN, AN, $HfO_2$, or $SiO_2$; however, a description will be made here, assuming that $TiO_2$ or $SiO_2$ is used.

Figure 14D:
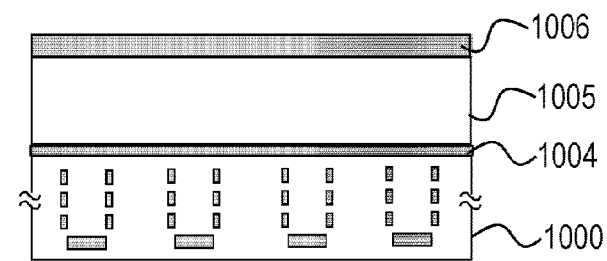

Next, as shown in FIG. 14D, on dielectric body 1005 is formed metal layer 1006 made of Al. Metal layer 1006 is formed by, for example, a thin film deposition technique such as a sputtering method, and a thickness of metal layer 1006 can be set in a range from 10 nm to 150 nm in the case of using an Ag thin film, for example. Metal layer 1006 finally functions as the wire grid polarizer.

Figure 15A:
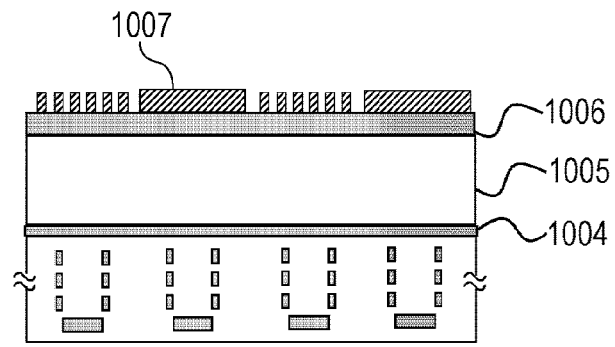
FIG. 15A to FIG. 15C are process sectional views showing a part of the example of the method for manufacturing the polarization imaging device of the second exemplary embodiment.
Figure 15B:
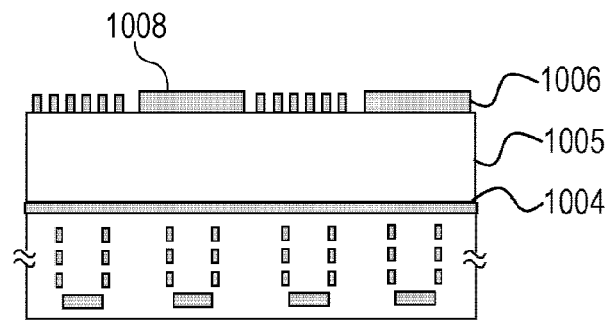
Figure 15C:
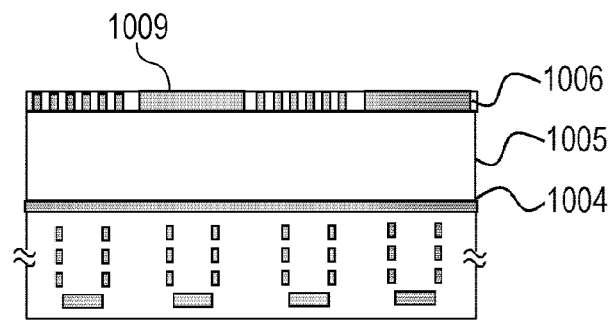

Next, as shown in FIG. 15A, on metal layer 1006 is formed resist pattern 1007 to have a negative shape to the wire grid polarizer by photolithography. Through dry etching using resist pattern 1007 as a mask, wire grid polarizer 1008 is formed as shown in FIG. 15B. However, in the steps of FIGS. 15A and 15B, instead of performing dry etching using a photoresist as a mask, a hard mask such as a dielectric film may be used as an etching mask. After this step, as shown in FIG. 15C, in a gap part in the wire grid polarizer is formed a $TiO_2$ layer or an $SiO_2$ layer 1009.

Figure 16A:
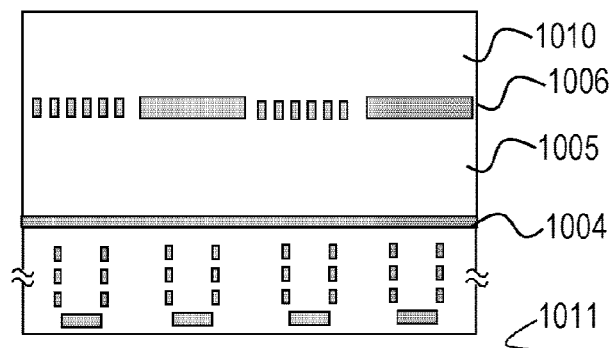
FIG. 16A to FIG. 16D are process sectional views showing a part of the example of the method for manufacturing the polarization imaging device of the second exemplary embodiment.

Next, as shown in FIG. 16A, on metal layer 1006 is formed second dielectric layer 1010. Second dielectric layer 1010 is formed by a thin film deposition technique such as plasma CVD method, and can be typically formed of $TiO_2$ or $SiO_2$. A thickness of second dielectric layer 1010 can be set in a range, for example, from 10 nm to 200 nm in the case of $SiO_2$. After that, an uppermost surface is flattened by CMP (Chemical Mechanical Polishing) method.

Figure 16B:
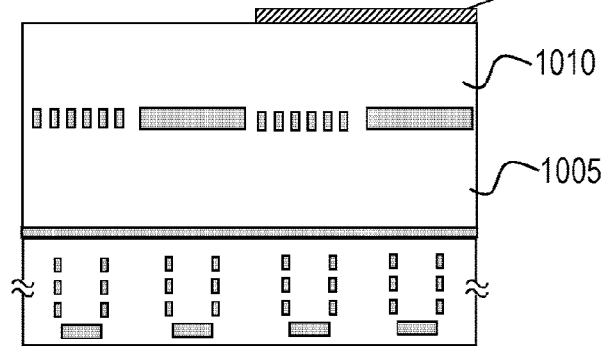
Figure 16C:
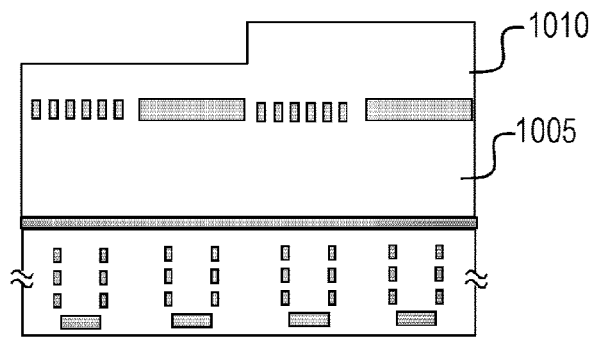
Figure 16D:
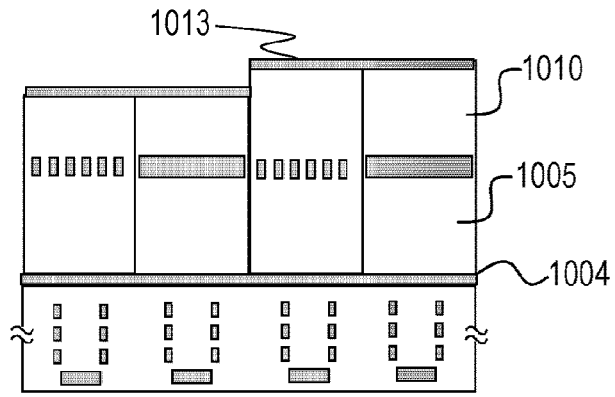

A total thickness of thus formed first dielectric layer 1005, metal layer 1006, and second dielectric layer 1010 defines the distance $L_R$, for a red color area, between the first metal layer and the second metal layer. In the color areas other than the red color area, distances between the first metal layer and the second metal layer are set to smaller values ($L_G$, $L_B$), which are smaller than $L_R$. For this reason, in the present exemplary embodiment, a step of etching second dielectric layer 1010 is performed on the color areas other than the red color area. Specifically, as shown in FIG. 16B, on the flattened $TiO_2$ layer or $SiO_2$ layer 1010 is formed resist pattern 1011 by photolithography. Resist pattern 1011 has a planar layout covering, for example, the red color area. After this step, as shown in FIG. 16C, by performing dry etching using resist pattern 1011 as a mask, the thickness of an area of second dielectric layer 1010 which is not covered by resist pattern 1011 is reduced. After this step, the thickness of second dielectric layer 1010 can be adjusted in three levels by forming another resist pattern (not shown in the drawing) and subsequently performing etching in a similar manner. Next, as shown in FIG. 16D, on second dielectric layer 1010 having a step-like shape is deposited metal layer 1013. Metal layer 1013 is made of, for example, Ag (silver) and is formed by a thin film deposition technique such as a sputtering method, and a thickness of metal layer 1013 can be set to a range, for example, from 10 nm to 40 nm. Metal layer 1013 functions as the first metal layer.

Through the above steps, the color polarization imaging device having the configuration shown in FIG. 6 is formed.

Because first metal layer 105 is formed on an uppermost surface of the optical filter in the present exemplary embodiment, if incident light is reflected by first metal layer 105, the reflected light from the surface of the imaging element is multiple reflected between the lens or other components, whereby there can be generated flare light. To prevent this issue, an antireflection layer may be further formed on the uppermost surface. This measure is also effective to prevent chemical reaction such as corrosion due to contact of the metal with air containing moisture.

First Application Example

Figure 17A:
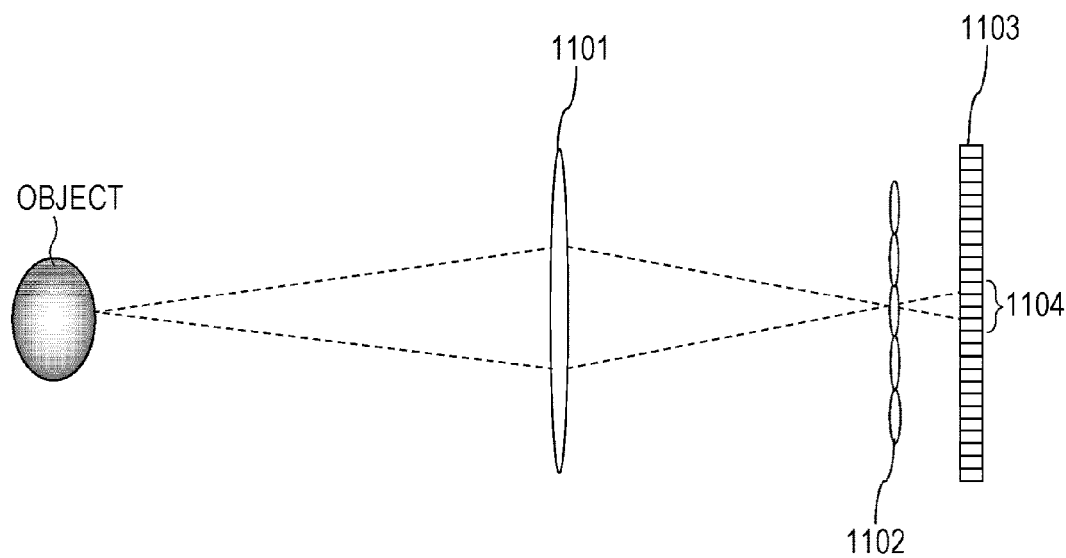
FIGS. 17A and 17B are diagrams showing a first application example in which a polarization imaging device of the present disclosure is combined with an objective lens and a micro-lens array.

FIG. 17A is a diagram showing a first application example of a stereoscopic polarization imaging device in which an objective lens and a micro-lens array are combined with the polarization imaging device of the present disclosure.

This stereoscopic imaging device comprises objective lens 1101, micro-lens array 1102, and polarization imaging device 1103 of the present disclosure. In a stereoscopic polarization imaging device disclosed in U.S. Patent Application Publication No. 2012/0319222, because light passing through different polarizing filters disposed on the right and left sides of an objective lens is divided by using a polarization imaging device, it is impossible to obtain polarized light information of an object itself. However, with the stereoscopic imaging device according to the exemplary embodiment of the present disclosure, it is possible to realize both of a function of stereoscopic view using micro-lenses and a function of polarization imaging.

Figure 17B:
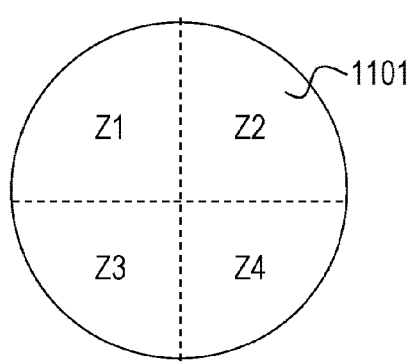
Figure 18:
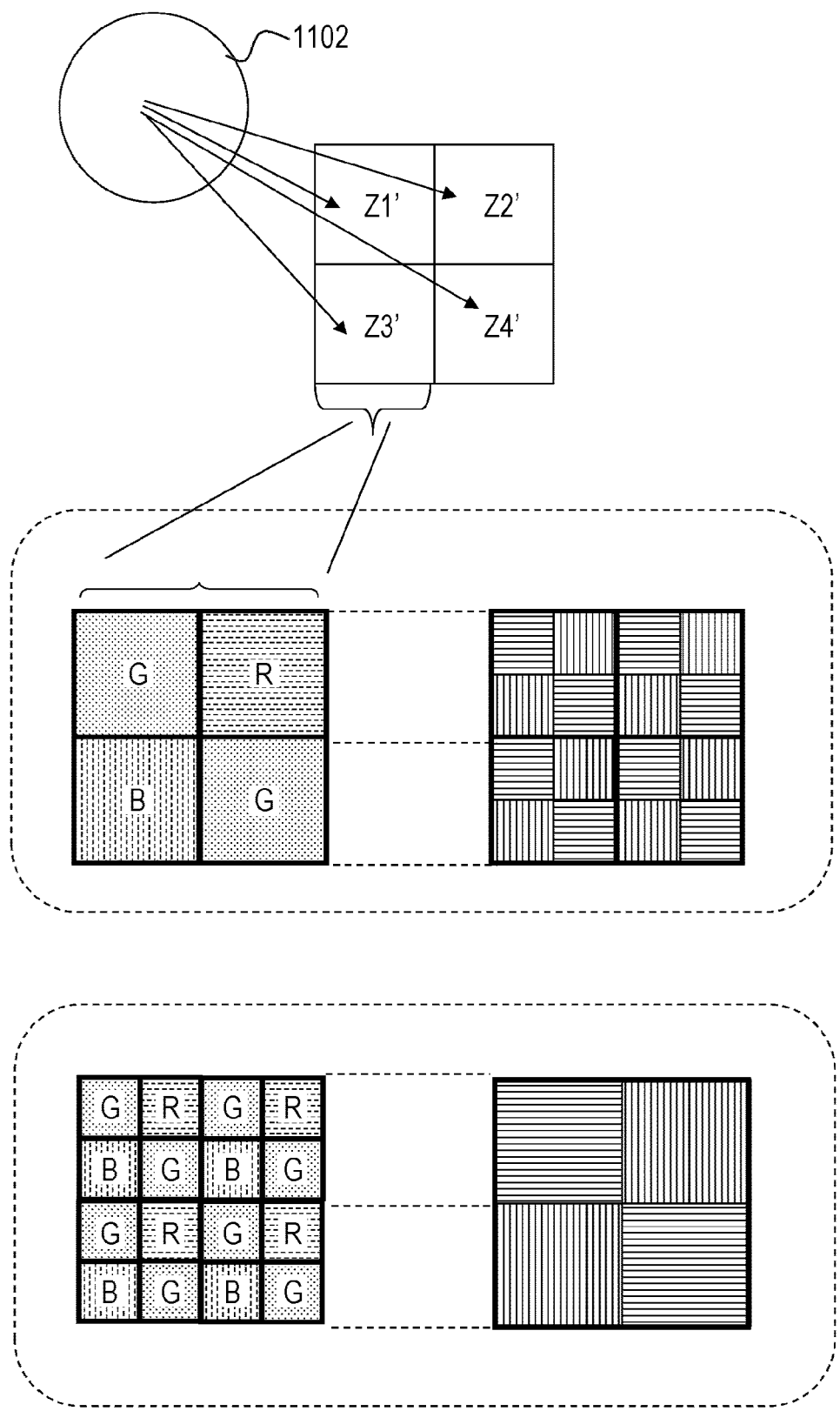
FIG. 18 are diagrams showing a second application example in which a polarization imaging device of the present disclosure is combined with an objective lens and a micro-lens array.

Light rays passing through four areas Z1 to Z4 (shown in FIG. 17B) in objective lens 1101 should originally be mixed on an imaging surface; however, in this application example, due to an action of each micro-lens of micro-lens array 1102, the four light rays can be focused separately. The upper part of FIG. 18 schematically shows which position on the imaging surface on a polarization imaging device in the exemplary embodiment of the present disclosure the four light rays divided by each micro-lens is focused on. The four light rays having passed through different areas Z1 to Z4 of objective lens 1101 are separated by the micro-lenses and each reach areas Z1' to Z4' in the imaging surface, respectively.

The middle and lower parts of FIG. 18 illustrate an optical filter configuration of these areas in a two-dimensional plane. First, the middle part of FIG. 18 shows the case that a correspondence relationship between the color mosaic and the wire grid polarizer mosaic in the first exemplary embodiment is used, and each light ray corresponds to a configuration made up of 4×4 pixels. On the other hand, the lower part of FIG. 18 shows the case that a correspondence relationship between the color mosaic and the wire grid polarizer described with respect to the fourth exemplary embodiment is used. In each of the cases, because an output of each photodiode corresponds to one unit of color image information and polarized light information, it is possible to obtain color polarized light information of different parallax positions corresponding to areas Z1 to Z4 on objective lens 1101.

Figure 19:
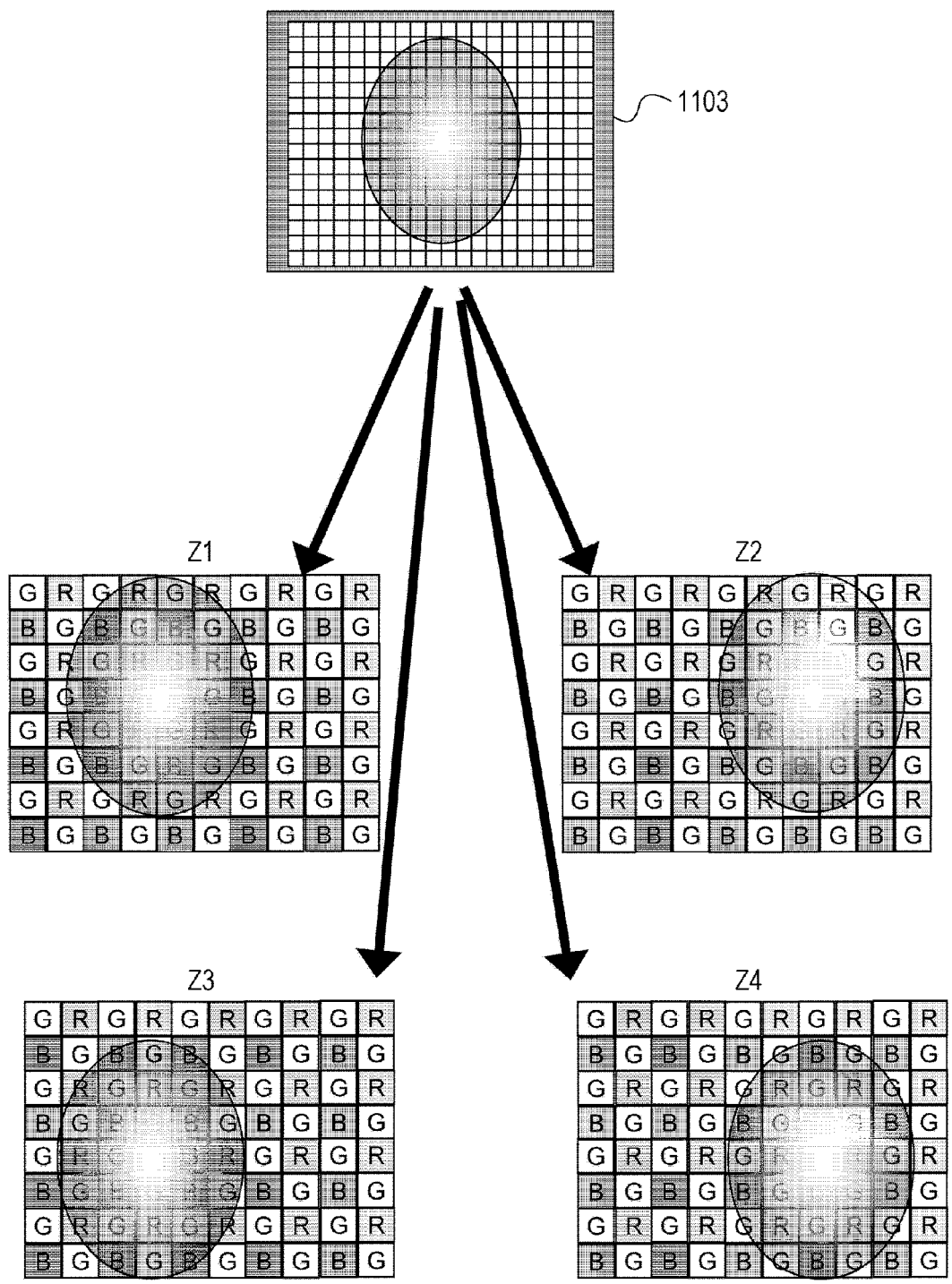
FIG. 19 is a diagram showing an image processing in the second application example of the present disclosure.

FIG. 19 is a diagram illustrating a process for extracting parallax images to be used for stereoscopic display, from images obtained with the first application example. One image of an object is formed on polarization imaging device 1103 when macroscopically viewed; thus, by performing division and reconstruction of pixel information as already described with reference to FIGS. 18A to 18C, four polarized light color images corresponding to areas Z1 to Z4 of objective lens 1101 are separately extracted. These separately extracted images are illustrated as color mosaic images in FIG. 19; however, the images are actually composite mosaic images of color and polarized light shown in the middle and lower parts of FIG. 18. That is to say, color polarized light images including polarized light information can be obtained. With the present application example, images including color information and polarization information can be obtained from a plurality of points of view in this manner, whereby stereoscopic images made up of color polarized light images can be obtained.

Second Application Example

Figure 20A:
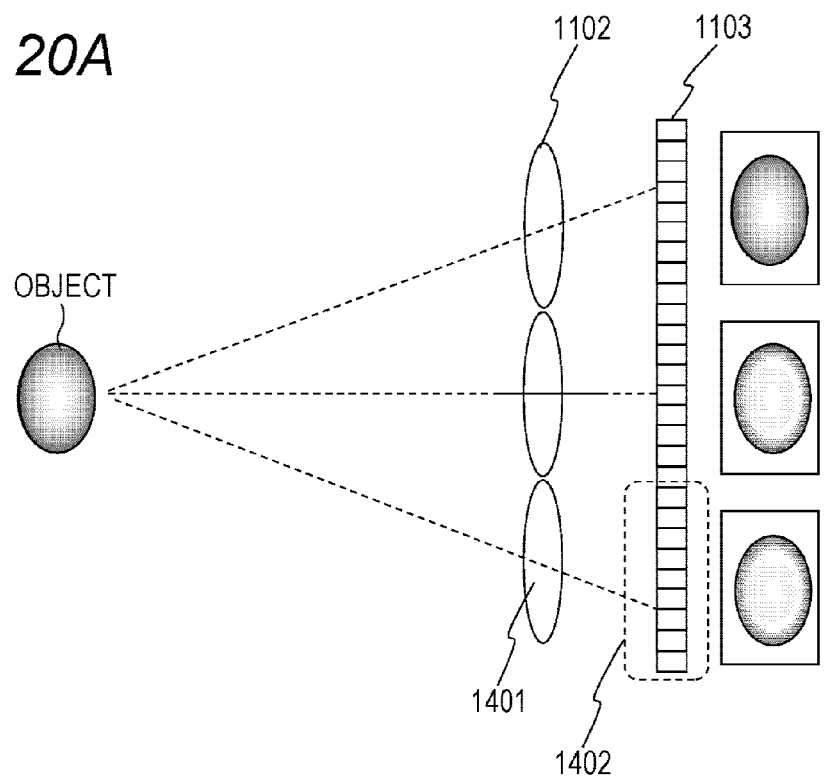
FIGS. 20A and 20B are diagrams showing a second application example in which a polarization imaging device of the present disclosure is combined with an objective lens and a micro-lens array.
Figure 20B:
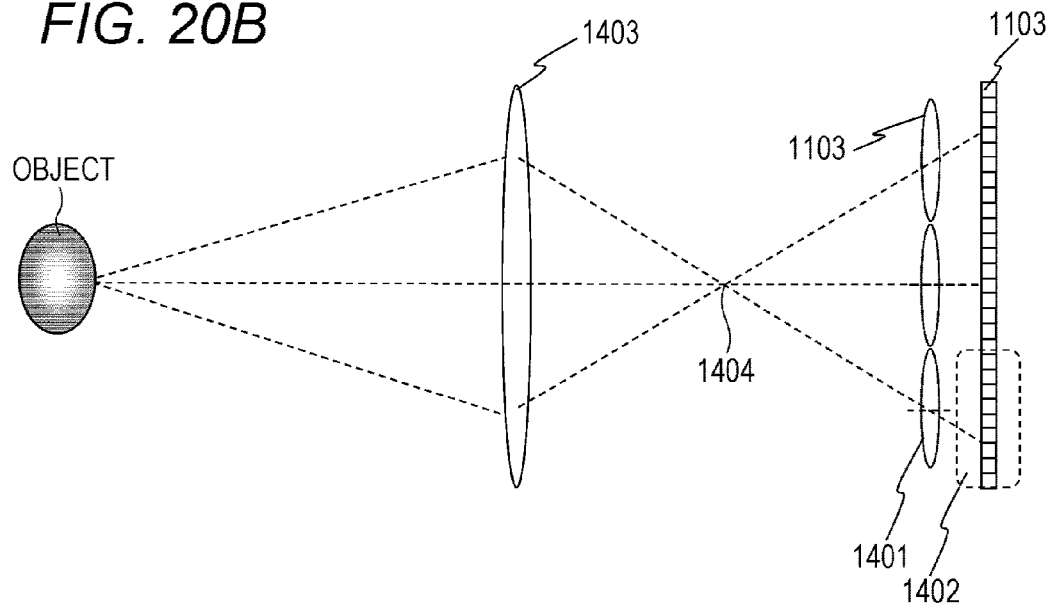

FIGS. 20A and 20B are diagrams showing a second application example of a stereoscopic polarization imaging device, in which a micro-lens array is combined with a polarization imaging device of the present disclosure. Any of the application examples comprises micro-lens array 1102 and polarization imaging device 1103 of the present disclosure.

This stereoscopic polarization imaging device can realize, similarly to the first application example, a function of stereoscopic view using micro-lens array 1102 and a function of polarization imaging. The difference from the first application example is that many micro-lenses 1401 included in micro-lens array 1102 function as a compound eye. That is to say, with the second application example, in individual eye areas 1402 corresponding to micro-lenses 1401 are formed the same number of object images including parallax information as a number of the micro-lenses. Because the plurality of images of the object include color information and polarized light information in themselves, stereoscopic images having color information and polarized light information can be generated.

With the example in FIG. 20A, compound-eye view is realized by using only micro-lens array 1102; and with the example in FIG. 20B, as disclosed in Unexamined Japanese Patent Publication No. 2013-74400, an object image is once formed at focus position 1404 by using objective lens 1403, and the object image is formed again by micro-lens array 1401.

Figure 21:
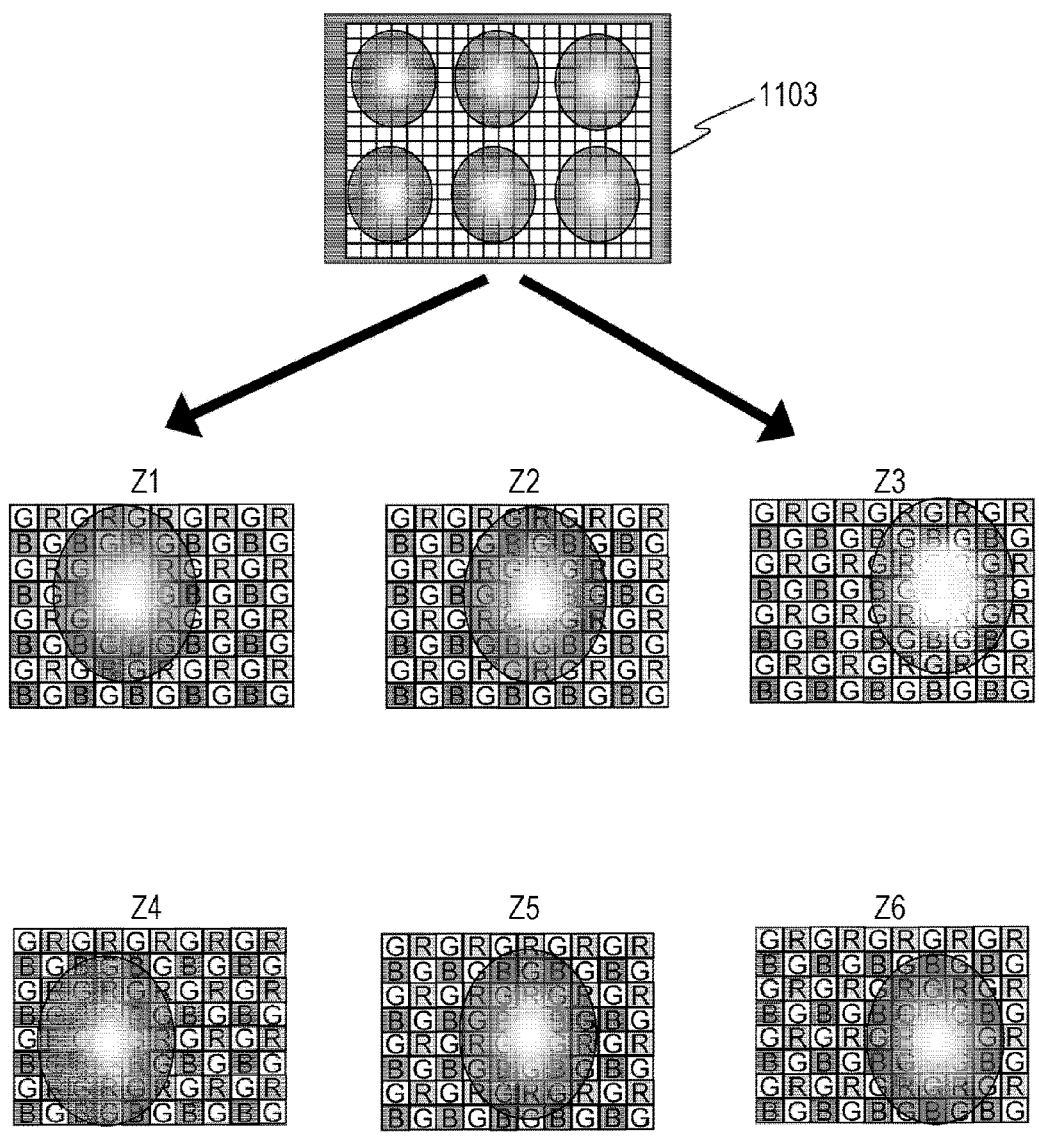
FIG. 21 is a diagram showing an image processing in the second application example of the present disclosure.

FIG. 21 is a drawing illustrating a process in which parallax images to be used for stereoscopic display are extracted from the images obtained in the second application example. On polarization imaging device 1103, there are formed the same number of object images (here, six images Z1 to Z6) as a number of the lenses of the micro-lens array when macroscopically viewed. Due to the division of the image, a plurality of polarized color images corresponding to Z1 to Z6 are separately extracted. These separately extracted images are illustrated as a color mosaic image in FIG. 21; however, the image is actually a composite mosaic image of color and polarized light shown in the middle and lower parts of FIG. 18. That is to say, color polarized light images including polarized light information can be obtained. With the present application example, images including color information and polarization information can be obtained from a plurality of points of view in this manner, whereby stereoscopic images made up of color polarized light images can be obtained.

Figure 22A:
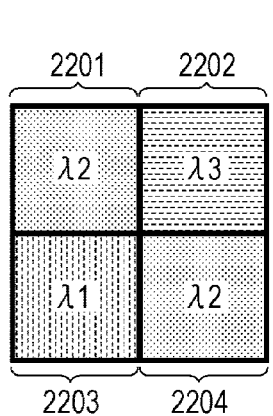
FIG. 22A is a diagram showing an optical filter related to a seventh exemplary embodiment of the present disclosure.
Figure 22B:
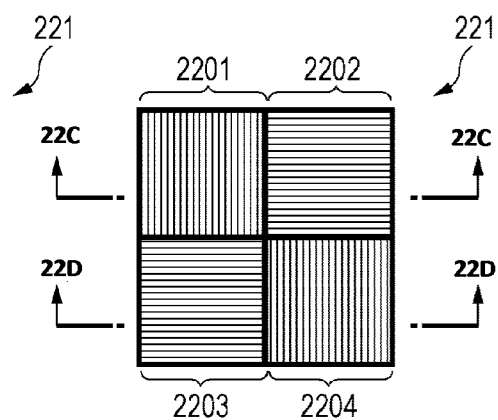
FIG. 22B is a diagram showing an optical filter related to a seventh exemplary embodiment of the present disclosure.
Figure 22C:
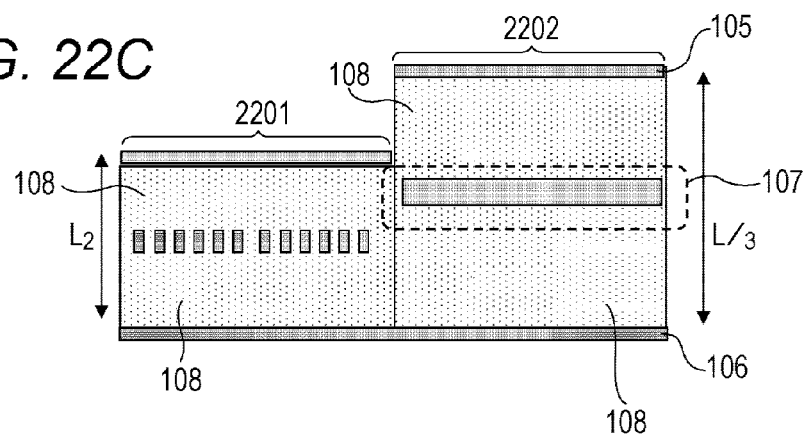
FIG. 22C is a diagram showing an optical filter related to a seventh exemplary embodiment of the present disclosure.
Figure 22D:
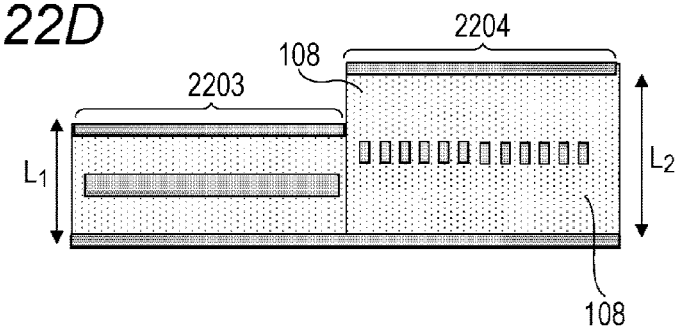
FIG. 22D is a diagram showing an optical filter related to a seventh exemplary embodiment of the present disclosure.

FIGS. 22A and 22B are upper surface views of an optical filter of a seventh exemplary embodiment of the present disclosure, and FIGS. 22C and 22D are the sectional views. These optical filters have the same structure as the polarization imaging device of FIG. 1 from which the imaging element part has been removed, and the optical filters provide optical filters which can simultaneously control light with any wavelength and polarization. FIG. 22A shows a mosaic configuration of the optical filters, and FIG. 22B shows the corresponding mosaic configuration wire grids. Individual wavelength transmissive areas are area 2201 transmissive for a wavelength λ2, area 2202 transmissive for a wavelength λ3, area 2203 transmissive for a wavelength λ1, and area 2204 transmissive for a wavelength λ2. The wavelengths λ1, □□λ2, and □λ3 represent arbitrary wavelength bands which do not overlap each other, and these wavelengths may be, for example, B, G, and R or may be narrower wavelength bands. The wavelength range may be an ultraviolet region or an infrared region other than a visible range. These wavelength transmissive areas are made up of 2×2 pixels, and the wavelength filters correspond to a 2×2 structure made up of two types of wire grids, which wire grids are arranged horizontally (0°) and vertically (90°) as shown in FIG. 22B. FIG. 22C is a sectional view in which the cross-section 22C-22C in FIG. 22B is viewed in the arrow direction, and λ2 transmissive area 2201 and λ3 transmissive area 2202 of the wavelength filters are shown in the drawing. The cross-sectional structures of the wavelength areas are each configured with upper surface metal thin film 105, lower surface metal thin film 106, dielectric layer 108 provided between the metal thin films 105 and 106, and metal wire grid 107 having directionality. Because the wire grids are alternately arranged in the 0° direction and the 90° direction in FIG. 22B, the wire grids are illustrated as a cross-sectional shape of two types in FIG. 22C. The same material is used for dielectric layers 108, but the distances $L_1$, $L_2$, and $L_3$ between the metal thin films are different between the wavelength areas; thus, areas between the metal thin films form Fabry-Perot interferometer type color filters, and only the light having the corresponding wavelengths λ1, λ2, and λ3 are selectively transmitted. As described later, due to the effect of wire grids 107, only the light (TM wave) having the electric field oscillating in the direction vertical to the direction of the wire grid is selectively transmitted for each of the wavelengths. The heights $L_1$, $L_2$, and $L_3$ of the optical filter are very thin and are some 10 nm to some 100 nm.

The operations have been already described in the first exemplary embodiment in the case where a white light W of P-wave (TM wave), which has the oscillation of electric field parallel to the paper surface, enters the optical filter; and in the case where a white light W of S-wave (TM wave), which has the oscillation of electric field parallel to the paper surface, enters the optical filter. Thus, the optical filters operate as optical filters in which selection of the wavelengths □λ1, λ2, and λ3 and two types of polarization of 0° and 90° are combined; and specifically, when non-polarized white light enters, there are obtained lateral (0°) transmitted light for the wavelengths λ1 and λ3 and vertical (90°) transmitted light for the wavelength λ2.

Figure 24A:
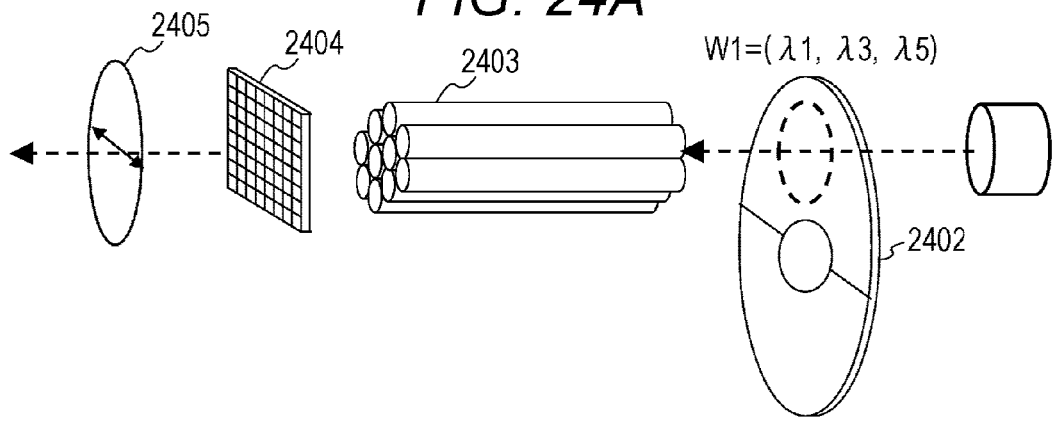
FIG. 24A is a diagram showing an application example of the optical filter related to the seventh exemplary embodiment of the present disclosure.
Figure 24B:
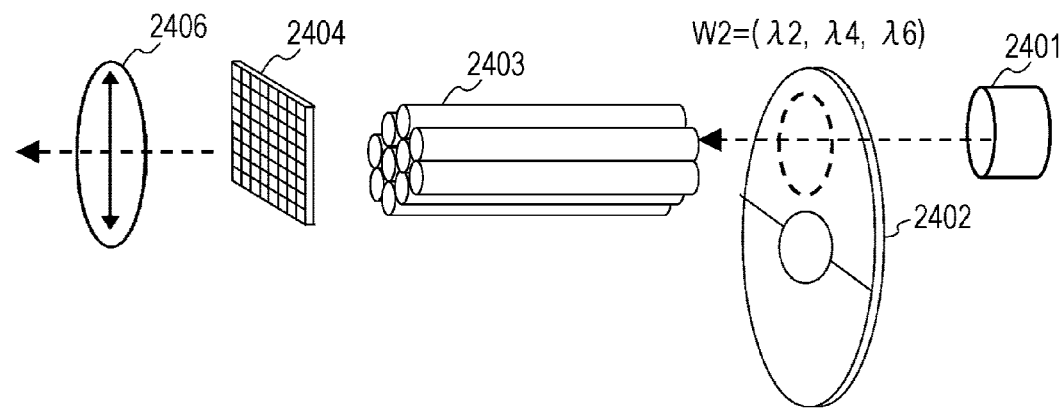
FIG. 24B is a diagram showing an application example of the optical filter related to the seventh exemplary embodiment of the present disclosure.

FIGS. 23A to 23F show three types of optical filters denoted by 2301 to 2303 as other planar configurations of the optical filter in the seventh exemplary embodiment. The optical filters actually have larger mosaic structures; however, FIGS. 23A to 23F show only a 4×4 mosaic areas for convenience. In optical filter 2301, a wavelength transmission mosaic configuration shown in FIG. 23A has six wavelength types of λ1 to λ6. Further, in the wire grid mosaic configuration made up of two types of wire grids of 0° and 90° shown in FIG. 23B, the wire grids having the same angle of 0° corresponds to the three types of wavelength bands λ2, λ4, and λ6 shown in FIG. 23A, and the wire grids having the same angle of 90° correspond to the three types of wavelength bands of λ1, λ3, and λ5. In this configuration, assuming that λ1 and λ2 are neighboring wavelengths of B area, □λ3 and λ4 are neighboring wavelengths of G area, and □λ5 and λ6 are neighboring wavelengths of R area, for example. Thus, when white light 1 constituted by □λ1, λ□, and □λ5 and white light 2 constituted by λ2, λ4, and □λ6 enter this optical filter, there is exhibited a specific function in which, when the white light 1 enters, a 0° linearly polarized light is emitted, and when the white 2 enters, a 90° linearly polarized light is emitted. FIGS. 24A and 24B illustrate an example of applying this function to a lighting device which employs a light guide and is for an endoscope or other application, and the lighting device is configured with light source 2401, color wheel 2402, light guide 2403, and optical filter 2404 of the present disclosure. In FIG. 24A, as described above, the white light 1 (W1) is emitted from the rotating color wheel, enters the light guide, and is transmitted. Then, a 0° linearly polarized light is radiated from the optical filter at an end part. In FIG. 24B, the color wheel rotates, and the white light 2 (W2) is then emitted from the color wheel, enters the light guide, and is transmitted. Then, a 90° linearly polarized light is radiated from the optical filter at the end part. The above operations are sequentially performed by the rotation of the color wheel, whereby the white light is radiated from the end of the light guide with an axis of the linear polarization rotating between 0° and 90° in turn. In optical filter 2302, a wavelength transmission mosaic configuration as shown in FIG. 23C has three wavelength types of λ1, λ2, and λ3. Further, the wire grid mosaic configuration shown in FIG. 23D is configured with, in addition to areas of 0° and 90°, areas without wire grid in a manner similar to the manner of the third exemplary embodiment shown in FIGS. 8A to 8C. Thus, there is exhibited a specific function in which polarized light of 90° is transmitted in the wavelength band λ1, polarized light of 0° is transmitted in the wavelength band λ2, but light is transmitted in the wavelength band λ3 with no polarization function being performed. This operation is the operation of a wavelength selection type polarizing element in a polarized light observation device disclosed in U.S. Pat. No. 8,803,959, and the optical filter of the present disclosure can be applied to this application.

In optical filter 2303, a wavelength transmission mosaic configuration shown in FIG. 23E has five wavelength types of λ1 to □λ5. Further, a wire grid mosaic configuration shown in FIG. 23F is configured with, in addition to areas having polarized light transmission axes in four directions of 0°, 45°, 90°, and 135°, areas without wired grid in a manner similar to the manner of the third exemplary embodiment shown in FIGS. 8A to 8C.

In FIG. 23E, the four wavelength bands of λ1, λ2, λ3, and □λ4 correspond to four directions of polarized light transmission axes of 0°, 45°, 90°, and 135°. Thus, there is exhibited a specific function in which, when the light in the wavelength bands λ1, λ2, λ3, and □λ4 sequentially enter this optical filter, the linearly polarized light is serially rotated by 45° for each wavelength band and is emitted, but when the light in the wavelength band λ5 enters, the light is emitted with no polarization function being performed.

(Numerical Simulation)

Figure 25:
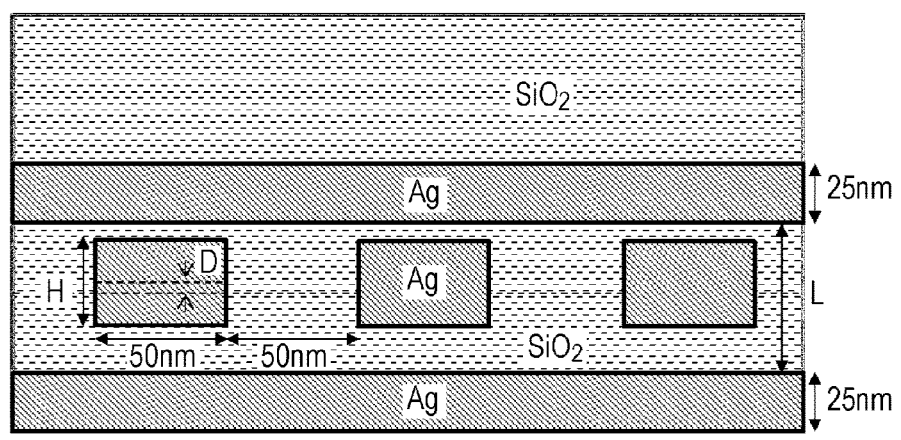
FIG. 25 is a sectional view of a configuration set in a simulation by RCWA (Strictly Coupled Wave Analyzing) method in the present disclosure.

There will be described an example in which a simulation was performed by RCWA (Strictly Coupled Wave Analyzing) method by using the structure shown in FIG. 25 as a basic shape of the present disclosure. With reference to FIG. 25, Ag (silver) is used as material for metal layers corresponding to upper and lower reflection plates and an intermediate wire grid layer, and $SiO_2$ is used for a dielectric layer among those components. Constant structural parameters were set as: a thickness of the Ag reflection plate=25 nm; and a line and a space of a periodic structure of the wire grid were 50 nm and 50 nm, respectively. In addition, the following values were variable: an interval L between the metal plates; a thickness H of the wire grid; and a displacement D of a center of the wire grid from a center of the interval between the metal plates. The above-described filter structure was assumed to be formed on the $SiO_2$ substrate, and light was assumed to enter from below.

The numerical values in this simulation are largely different from the numerical value in the simple theoretical description of the present disclosure. This difference is due to complicated interaction caused by the additional insertion of metal between the metal reflection plates.

Figure 26:
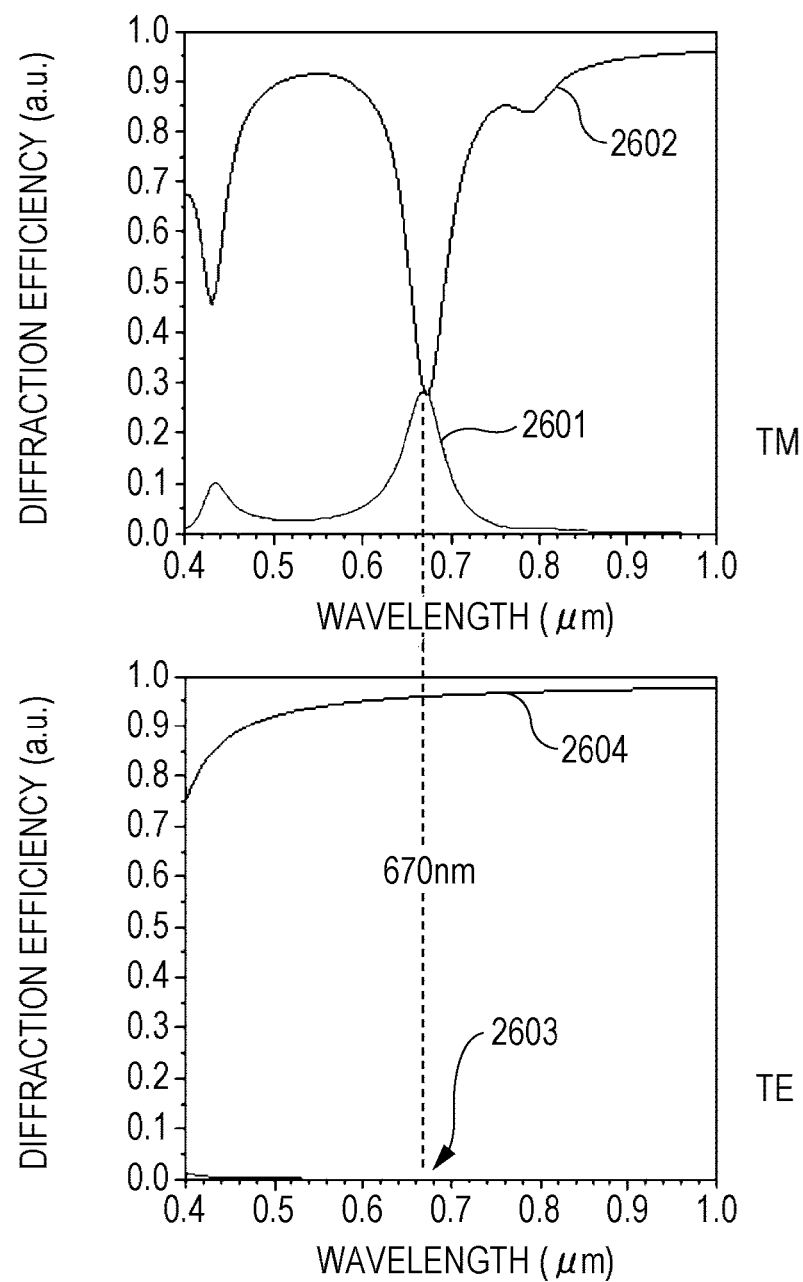
FIG. 26 is a graph obtained in the simulation by RCWA (Strictly Coupled Wave Analyzing) method, where L=122 nm, H=120 nm, and D=0 nm.

FIG. 26 shows the result obtained when L=122 nm, H=120 nm, and D=0 nm. In the drawing, the numeric symbols 2601 denotes the TM transmittance, the numeric symbol 2602 the TM reflectance, the numeric symbol 2603 the TE transmittance, and the numeric symbol 2604 the TE reflectance. As apparent in the drawing, the TM transmittance=approximately 30% is shown at the central wavelength of transmission=670 nm (Red area), at which wavelength the extinction ratio=approximately 2981:1 was obtained.

Figure 27:
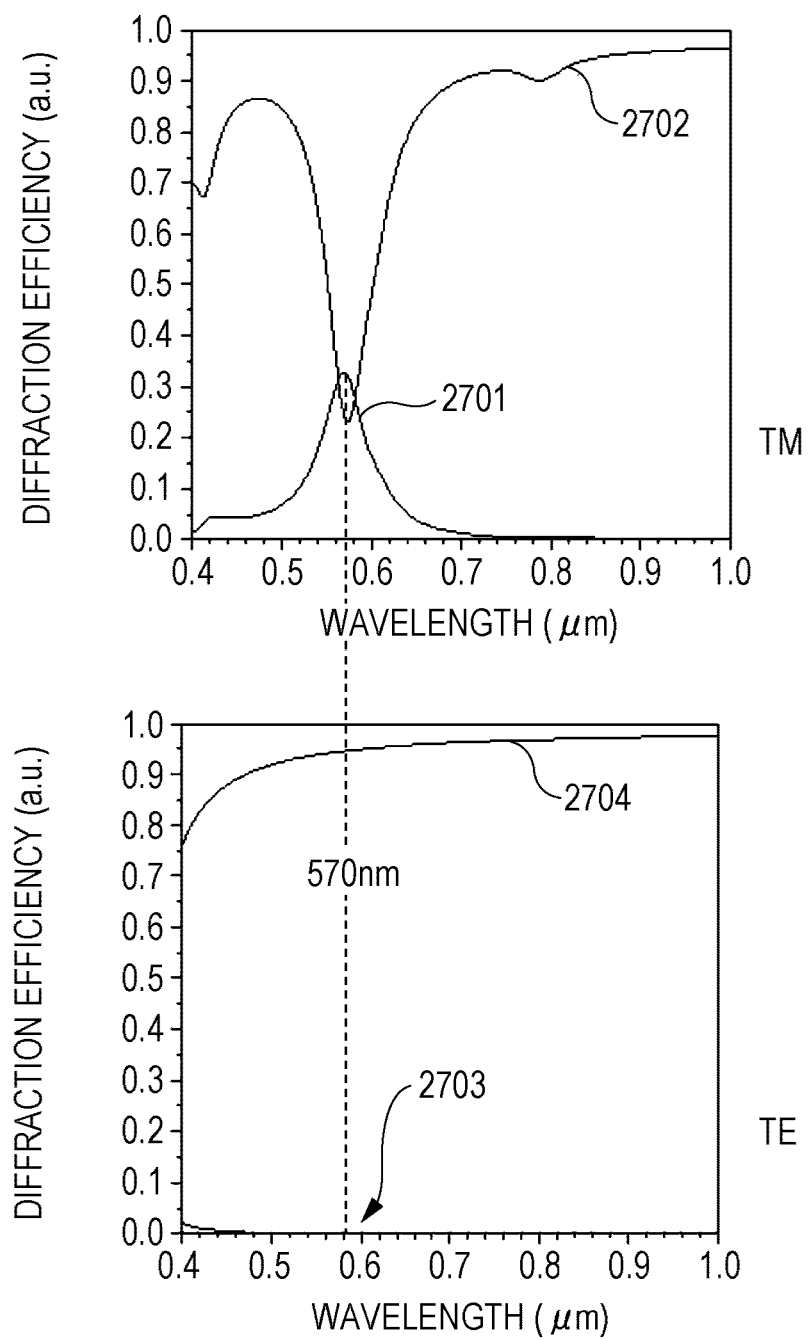
FIG. 27 is a graph obtained in the simulation by RCWA (Strictly Coupled Wave Analyzing) method, where L=92 nm, H=90 nm, and D=0 nm.

FIG. 27 shows the result obtained when L=92 nm, H=90 nm, and D=0 nm. In the drawing, the numeric symbol 2701 denotes the TM transmittance, the numeric symbol 2702 the TM reflectance, the numeric symbol 2703 the TE transmittance, and the numeric symbol 2704 the TE reflectance. As apparent from the drawing, the TM transmittance=approximately 30% is shown at the central wavelength of transmission=570 nm (Green area), at which wavelength the extinction ratio=approximately 385:1 was obtained.

Figure 28:
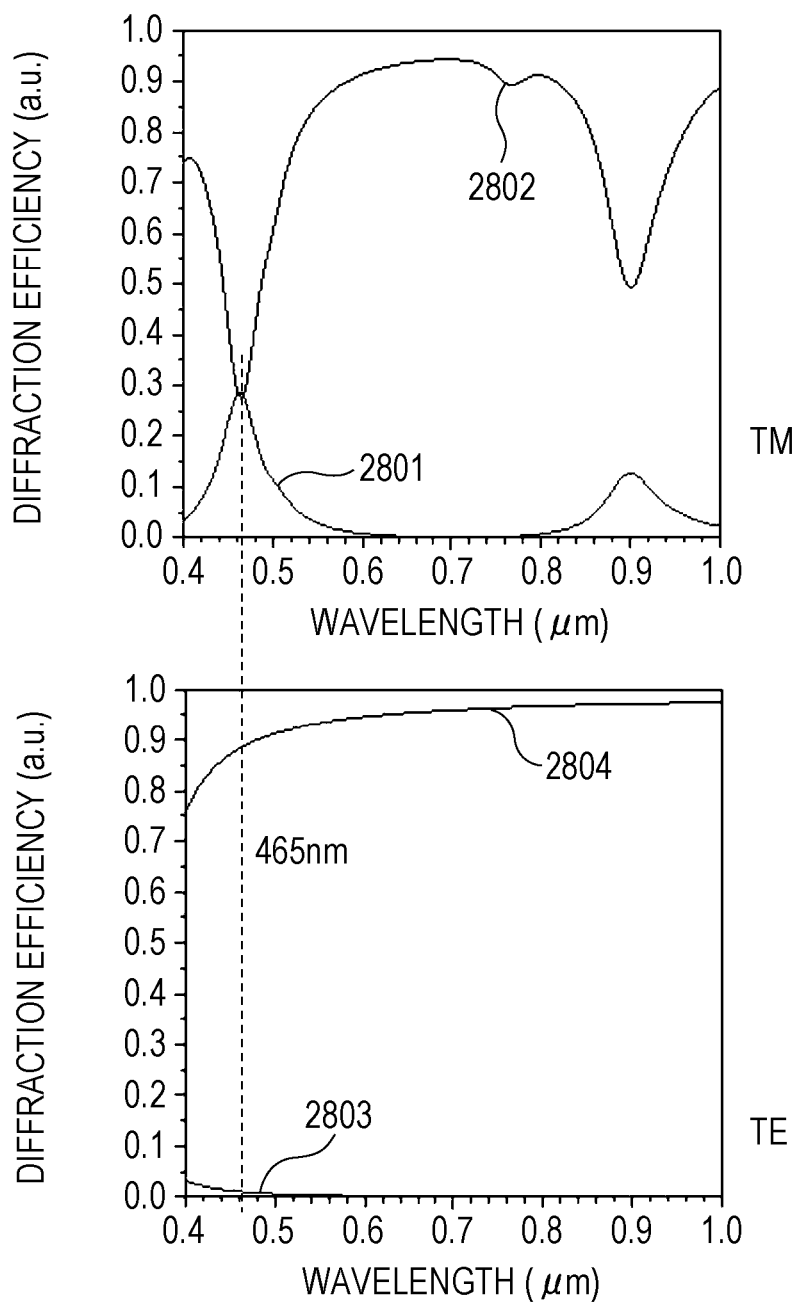
FIG. 28 is a graph obtained in the simulation by RCWA (Strictly Coupled Wave Analyzing) method, where L=67 nm, H=59 nm, and D=0 nm.

FIG. 28 shows the result obtained when L=67 nm, H=59 nm, D=0 nm. In the drawing, the numeric symbol 2801 denotes the TM transmittance, the numeric symbol 2802 the TM reflectance, the numeric symbol 2803 the TE transmittance, and the numeric symbol 2804 the TE reflectance. As apparent in the drawing, the TM transmittance=approximately 28% is shown at the central wavelength of transmission=465 nm (Blue area), at which wavelength the extinction ratio=approximately 25:1 was obtained.

The experiments which were conducted by the inventors of the present invention in the Green area, whose central wavelength of transmission was 570 nm, show that, in the case where the Fabry-Perot type color filter layer using Ag and a wire grid layer using Ag are simply stacked in the same way as a conventional optical filter and were used, the extinction ratio decreased to about 12:1 regardless of the order of stacking of the color filter and the wire grid layer. The inventors judge that this fact confirms the effectiveness of the structure of the present disclosure in which the metal wire grid layer is interposed between two metal layers.

In the simulation, Ag was used to simultaneously use the transmission wavelengths of R, G, and B in the visible light range; however, Au (gold), Cu (copper), Al (aluminum), W (tungsten), and Ti (titanium) can also be used as the metal, and these materials can be selectively used, depending on a wavelength band mainly used.

INDUSTRIAL APPLICABILITY

An exemplary embodiment of a polarization imaging device of the present disclosure can realizes a color polarization imaging device and a polarized illumination device which are small but realize high performances. Therefore, the exemplary embodiments of the present disclosure are widely applicable to the field of image processing as follows: flexible endoscopes for medical testing; rigid endoscopes for surgery; cameras for skin observation; industrial endoscopes; cameras for fish and livestock relating foods and sensing living things; imaging devices for biometrics or fingerprints; surface checking, on an on-vehicle camera, of a road surface in a rainy weather; obstacle observation; vehicle identification; and surveillance cameras. In particular, the exemplary embodiments of the present disclosure are widely applicable to generation of color images, from which directly reflected light (halation) from a smooth surface such as a mucus membrane, glass, or a road surface has been removed, and which has been conventionally impossible due to low extinction ratios. In addition, when the exemplary embodiments of the present disclosure is combined with a micro-lens optical system, parallax images can also be generated, whereby a stereoscopic view can be realized independently from obtaining color polarized light information. Therefore, there is no such problem that a stereoscopic view is conventionally realized at the cost of the polarized light information of an object.

Note that, in an optical filter of the present disclosure, polarization state can be wavelength-selectively changed. Thus, the optical filter can be used as a filter for polarized illumination, and a conventional process in which a polarization filter and a wavelength filter are separately formed and then laminated is eliminated; and in addition, the accuracy is improved.

REFERENCE SINGS LIST 10 imaging surface
20 photoelectric conversion element
100 photoelectric conversion element array
101 G area
102 R area
103 B area
104 G area
105 first metal layer
106 second metal layer
107 wire grid polarizer
108 dielectric body
109 wiring layer
110 photodiode
200 optical filter
300 light

What is claimed is:
1. An optical filter comprising:
a Fabry-Perot resonator comprising a laminated structure including one sheet of first metal layer, one sheet of second metal layer, and a dielectric layer; and
one sheet of plate-shaped wire grid polarizer,
wherein
the second metal layer is parallel to the first metal layer;
the dielectric layer is interposed between the first metal layer and the second metal layer;
the one sheet of plate-shaped wire grid polarizer is embedded in the dielectric layer;
the one sheet of plate-shaped wire grid polarizer comprises three or more metal wire layers;
the metal wire layers are parallel to one another; and
the one sheet of plate-shaped wire grid polarizer is parallel to the first metal layer.

2. The optical filter according to claim 1, wherein
the one sheet of plate-shaped wire grid polarizer is located approximately in a middle between the first metal layer and the second metal layer.

3. The optical filter according to claim 1, wherein
light having a first polarization plane perpendicular to the metal wire layers is transmitted through the one sheet of plate-shaped wire grid polarizer; and
light having a second polarization plane parallel to the metal wire layers is blocked by the one sheet of plate-shaped wire grid polarizer.

4. The optical filter according to claim 1, wherein
a space formed between neighboring two adjacent metal wire layers of the three or more metal wire layers is filled with the dielectric layer.

5. The optical filter according to claim 1, wherein
each of the metal wire layers is parallel to the first metal layer.

6. A polarization imaging element comprising:
a photoelectric conversion element having an imaging surface; and
a first optical filter disposed to face the imaging surface, wherein
the first optical filter is an optical filter comprising:
a Fabry-Perot resonator comprising a laminated structure including one sheet of first metal layer, one sheet of second metal layer, and a dielectric layer; and
one sheet of plate-shaped wire grid polarizer;
the second metal layer is parallel to the first metal layer;
the dielectric layer is interposed between the first metal layer and the second metal layer;
the one sheet of plate-shaped wire grid polarizer is embedded in the dielectric layer;
the one sheet of plate-shaped wire grid polarizer comprises three or more metal wire layers;
the metal wire layers are parallel to one another; and
the one sheet of plate-shaped wire grid polarizer is parallel to the first metal layer.

7. The polarization imaging element according to claim 6, further comprising:
a second optical filter disposed to face the imaging surface,
wherein
the second optical filter is the optical filter comprising:
a Fabry-Perot resonator comprising a laminated structure including one sheet of first metal layer, one sheet of second metal layer, and a dielectric layer; and
one sheet of plate-shaped wire grid polarizer;
the second metal layer of the second optical filter is parallel to the first metal layer of the second optical filter;
the dielectric layer of the second optical filter is interposed between the first metal layer of the second optical filter and the second metal layer of the second optical filter;
the one sheet of plate-shaped wire grid polarizer of the second optical filter is embedded in the dielectric layer of the second optical filter;
the one sheet of plate-shaped wire grid polarizer of the second optical filter comprises three or more metal wire layers;
the metal wire layers of the second optical filter are parallel to one another;
the one sheet of plate-shaped wire grid polarizer of the second optical filter is parallel to the first metal layer; and
the first optical filter is located adjacent to the second optical filter.

8. The polarization imaging element according to claim 7, wherein,
in a planar view, a longitudinal direction of the metal wire layers included in the first optical filter is different from a longitudinal direction of the metal wire layers included in the second optical filter.

9. The polarization imaging element according to claim 7, further comprising:
a third optical filter disposed to face the imaging surface, wherein
the third optical filter is the optical filter comprising:
a Fabry-Perot resonator comprising a laminated structure including one sheet of first metal layer, one sheet of second metal layer, and a dielectric layer; and
one sheet of plate-shaped wire grid polarizer;
the second metal layer of the third optical filter is parallel to the first metal layer of the third optical filter;
the dielectric layer of the third optical filter is interposed between the first metal layer of the third optical filter and the second metal layer of the third optical filter;
the one sheet of plate-shaped wire grid polarizer of the third optical filter is embedded in the dielectric layer of the third optical filter;
the one sheet of plate-shaped wire grid polarizer of the third optical filter comprises three or more metal wire layers;
the metal wire layers of the third optical filter are parallel to one another;
the one sheet of plate-shaped wire grid polarizer of the third optical filter is parallel to the first metal layer of the third optical filter;
the third optical filter is located adjacent to the first optical filter or the second optical filter,
in a planar view, a longitudinal direction of the metal wire layers included in the third optical filter is different from the longitudinal direction of the metal wire layers included in the first optical filter; and
in the planar view, the longitudinal direction of the metal wire layers included in the third optical filter is different from the longitudinal direction of the metal wire layers included in the second optical filter.

10. A polarization imaging device comprising:
a plurality of polarization imaging elements,
wherein
each of the plurality of polarization imaging elements is the polarization imaging element comprising:
a photoelectric conversion element having an imaging surface; and
a first optical filter disposed to face the imaging surface;
the first optical filter is an optical filter comprising:
a Fabry-Perot resonator comprising a laminated structure including one sheet of first metal layer, one sheet of second metal layer, and a dielectric layer; and
one sheet of plate-shaped wire grid polarizer;
the second metal layer is parallel to the first metal layer;
the dielectric layer is interposed between the first metal layer and the second metal layer;
the one sheet of plate-shaped wire grid polarizer is embedded in the dielectric layer;
the one sheet of plate-shaped wire grid polarizer comprises three or more metal wire layers;
the metal wire layers are parallel to one another; and
the one sheet of plate-shaped wire grid polarizer is parallel to the first metal layer.

11. The polarization imaging device according to claim 10, wherein
the plurality of polarization imaging elements include a first polarization imaging element, a second polarization imaging element, and a third polarization imaging element;
each of the polarization imaging elements faces the imaging surface;
the dielectric layers included in the first polarization imaging element, the second polarization imaging element, and the third polarization imaging element have different thicknesses so that red light, green light, and blue light pass through the first polarization imaging element, the second polarization imaging element, and the third polarization imaging element, respectively; and
the first polarization imaging element, the second polarization imaging element, and the third polarization imaging element define an R pixel, a G pixel, and a B pixel, respectively.

12. The polarization imaging device according to claim 11, wherein
an interval between the one sheet of plate-shaped wire grid polarizer included in the first polarization imaging element and the second metal layer included in the first polarization imaging element is different from an interval between the one sheet of plate-shaped wire grid polarizer included in the second polarization imaging element and the second metal layer included in the second polarization imaging element;
the interval between the one sheet of plate-shaped wire grid polarizer included in the second polarization imaging element and the second metal layer included in the second polarization imaging element is different from an interval between the one sheet of plate-shaped wire grid polarizer included in the third polarization imaging element and the second metal layer included in the third polarization imaging element; and
the interval between the one sheet of plate-shaped wire grid polarizer included in the third polarization imaging element and the second metal layer included in the third polarization imaging element is different from the interval between the one sheet of plate-shaped wire grid polarizer included in the first polarization imaging element and the second metal layer included in the first polarization imaging element.

13. The polarization imaging device according to claim 11, wherein
an interval between the one sheet of plate-shaped wire grid polarizer included in the first polarization imaging element and the second metal layer included in the first optical filter is the same as an interval between the one sheet of plate-shaped wire grid polarizer included in the second polarization imaging element and the second metal layer included in the second optical filter; and
the interval between the one sheet of plate-shaped wire grid polarizer included in the second polarization imaging element and the second metal layer included in the second optical filter is the same as an interval between the one sheet of plate-shaped wire grid polarizer included in the third polarization imaging element and the second metal layer included in the third polarization imaging element.

14. The polarization imaging device according to claim 10, further comprising:
a fourth polarization optical element disposed to face the imaging surface, the fourth polarization optical element comprising:
a Fabry-Perot resonator including a laminated structure including one sheet of first metal layer, one sheet of second metal layer, and a dielectric layer,
wherein
the fourth polarization optical element does not comprise a wire grid polarizer.

15. The optical filter according to claim 1, wherein
the dielectric layer includes an air layer; and
the one sheet of plate-shaped wire grid polarizer is provided in the air layer.

16. A stereoscopic polarization imaging device comprising:
the polarization imaging device; and
a micro-lens array combined with the polarization imaging device,
wherein
the polarization imaging device comprises a plurality of polarization imaging elements;
each of the plurality of polarization imaging elements is the polarization imaging element comprising:
a photoelectric conversion element having an imaging surface; and
a first optical filter disposed to face the imaging surface;
the first optical filter is an optical filter comprising:
a Fabry-Perot resonator comprising a laminated structure including one sheet of first metal layer, one sheet of second metal layer, and a dielectric layer; and
one sheet of plate-shaped wire grid polarizer;
the second metal layer is parallel to the first metal layer;
the dielectric layer is interposed between the first metal layer and the second metal layer;
the one sheet of plate-shaped wire grid polarizer is embedded in the dielectric layer;
the one sheet of plate-shaped wire grid polarizer comprises three or more metal wire layers;
the metal wire layers are parallel to one another; and
the one sheet of plate-shaped wire grid polarizer is parallel to the first metal layer.

* * * * *